US011387267B2

(12) United States Patent
Nakanishi et al.

(10) Patent No.: US 11,387,267 B2
(45) Date of Patent: Jul. 12, 2022

(54) IMAGE SENSOR, FOCUS ADJUSTMENT DEVICE, AND IMAGING DEVICE

(71) Applicant: NIKON CORPORATION, Tokyo (JP)

(72) Inventors: Sota Nakanishi, Kawasaki (JP); Wataru Funamizu, Yokohama (JP); Masahiro Juen, Yokohama (JP)

(73) Assignee: NIKON CORPORATION, Tokyo (JP)

( * ) Notice: Subject to any disclaimer, the term of this patent is extended or adjusted under 35 U.S.C. 154(b) by 287 days.

(21) Appl. No.: 16/499,737

(22) PCT Filed: Mar. 28, 2018

(86) PCT No.: PCT/JP2018/012977
§ 371 (c)(1),
(2) Date: Sep. 30, 2019

(87) PCT Pub. No.: WO2018/181582
PCT Pub. Date: Oct. 4, 2018

(65) Prior Publication Data
US 2021/0104562 A1    Apr. 8, 2021

(30) Foreign Application Priority Data

Mar. 30, 2017  (JP) .............................. JP2017-068452

(51) Int. Cl.
*H01L 27/146* (2006.01)
*H01L 27/148* (2006.01)
(Continued)

(52) U.S. Cl.
CPC .. *H01L 27/14612* (2013.01); *H01L 27/14636* (2013.01); *H01L 27/14643* (2013.01);
(Continued)

(58) Field of Classification Search
CPC ........... H04N 5/232122; H04N 5/3745; H04N 5/37452; H04N 5/23212; H04N 5/232;
(Continued)

(56) References Cited

U.S. PATENT DOCUMENTS

2016/0198109 A1   7/2016  Ishii et al.
2016/0344962 A1  11/2016  Hirai
2016/0353043 A1*  12/2016  Kishi ................. H04N 5/37457

FOREIGN PATENT DOCUMENTS

JP   2013-090160 A   5/2013
JP   2016-024234 A   2/2016
(Continued)

OTHER PUBLICATIONS

Engllish Machine Translation of JP-2016024234-A. No Date.*
(Continued)

*Primary Examiner* — Hrayr A Sayadian
(74) *Attorney, Agent, or Firm* — Oliff PLC

(57) ABSTRACT

An image sensor includes a plurality of pixels each including: a first and a second photoelectric conversion unit that perform photoelectric conversion upon light that has passed through a micro lens and generates a charge; a first accumulation unit that accumulates the charge generated by the first conversion unit; a second accumulation unit that accumulates the charge generated by the second conversion unit; a third accumulation unit that accumulates the charges generated by the first and second conversion units; a first transfer unit that transfers the charge generated by the first conversion unit to the first accumulation unit; a second transfer unit that transfers the charge generated by the second conversion unit to the second accumulation unit; and a third transfer unit that transfers the charges generated by the first and second conversion units to the third accumulation unit.

16 Claims, 19 Drawing Sheets

(51) Int. Cl.
   *H04N 5/232* (2006.01)
   *H04N 5/3745* (2011.01)

(52) U.S. Cl.
   CPC ... *H01L 27/14831* (2013.01); *H04N 5/23212* (2013.01); *H04N 5/37452* (2013.01)

(58) Field of Classification Search
   CPC ............... H04N 5/347; H04N 5/36961; H01L 27/14612; H01L 27/14636; H01L 27/14831; H01L 27/14641; H01L 27/14643; G02B 7/34; G03B 13/36
   USPC ................................................ 257/292, 438
   See application file for complete search history.

(56) References Cited

FOREIGN PATENT DOCUMENTS

| | | | |
|---|---|---|---|
| JP | 2016024234 A | * | 2/2016 |
| JP | 2016-127454 A | | 7/2016 |
| JP | 2016-206556 A | | 12/2016 |
| JP | 2016-220078 A | | 12/2016 |

OTHER PUBLICATIONS

Mar. 26, 2021 Office Action issued in Chinese Patent Application No. 201880022406.6.
Jun. 26, 2018 International Search Report issued in International Patent Application No. PCT/JP2018/012977.
Aug. 3, 2021 Office Action issued in Japanese Patent Application No. 2019-510046.
Mar. 15, 2022 Office Action issued in Japanese Patent Application No. 2019-510046.

* cited by examiner

IMAGE SENSOR, FOCUS ADJUSTMENT DEVICE, AND IMAGING DEVICE

TECHNICAL FIELD

The present invention relates to an image sensor, to a focus adjustment device, and to an imaging device.

BACKGROUND ART

An image sensor is per se known that individually reads out first and second signals due to first and second photoelectric conversion units from pixels that each include those first and second photoelectric conversion units; and an image sensor is per se known that is capable of reading out such first and second signals while adding them together (refer to PTL1). In prior art devices, when the signals are individually read out, the electrical charges of the first and second photoelectric conversion units are individually transferred to first and second FDs. Moreover, when the signals are read out while being added together, the electrical charges of the first and second photoelectric conversion units are transferred to first and second FDs that are electrically connected thereto.

CITATION LIST

Patent Literature

PTL1: Japanese Laid-Open Patent Publication No. 2013-90160.

SUMMARY OF INVENTION

According to the 1st aspect of the present invention, an image sensor comprises a plurality of pixels, each comprising: a first photoelectric conversion unit that performs photoelectric conversion upon light that has passed through a micro lens and generates a charge; a second photoelectric conversion unit that performs photoelectric conversion upon light that has passed through the micro lens and generates a charge; a first accumulation unit that accumulates the charge generated by the first photoelectric conversion unit; a second accumulation unit that accumulates the charge generated by the second photoelectric conversion unit; a third accumulation unit that accumulates the charge generated by the first photoelectric conversion unit and the charge generated by the second photoelectric conversion unit; a first transfer unit that transfers the charge generated by the first photoelectric conversion unit to the first accumulation unit; a second transfer unit that transfers the charge generated by the second photoelectric conversion unit to the second accumulation unit; and a third transfer unit that transfers the charge generated by the first photoelectric conversion unit and the charge generated by the second photoelectric conversion unit to the third accumulation unit.

According to the 2nd aspect of the present invention, a focus adjustment device comprises: an image sensor according to the 1st aspect that captures an image formed by an optical system that comprises a focusing lens; and a control unit that, based upon a signal according to the charge accumulated in a first accumulation unit of the image sensor and a signal according to the charge accumulated in a second accumulation unit of the image sensor, controls a position of the focusing lens so as to focus an image formed upon the image sensor by the optical system.

According to the 3rd aspect of the present invention, an imaging device comprises: an image sensor according to the 1st aspect that captures an image formed by an optical system that comprises a focusing lens; a control unit that, based upon a signal according to the charge accumulated in a first accumulation unit of the image sensor and a signal according to the charge accumulated in the second accumulation unit of the image sensor, controls a position of the focusing lens so as to focus an image formed upon the image sensor by the optical system; and a generation unit that generates image data based upon a signal according to the charge accumulated in the third accumulation unit.

According to the 4th aspect of the present invention, an imaging device comprises: an image sensor according to the 1st aspect; and a generation unit that generates image data based upon at least one of charge accumulated in the first accumulation unit and the second accumulation unit that are connected together by the connection unit, and the charge accumulated in the third accumulation unit.

DESCRIPTION OF EMBODIMENTS

Embodiments of the present invention will now be explained with reference to the drawings.

The First Embodiment

Figure 1:
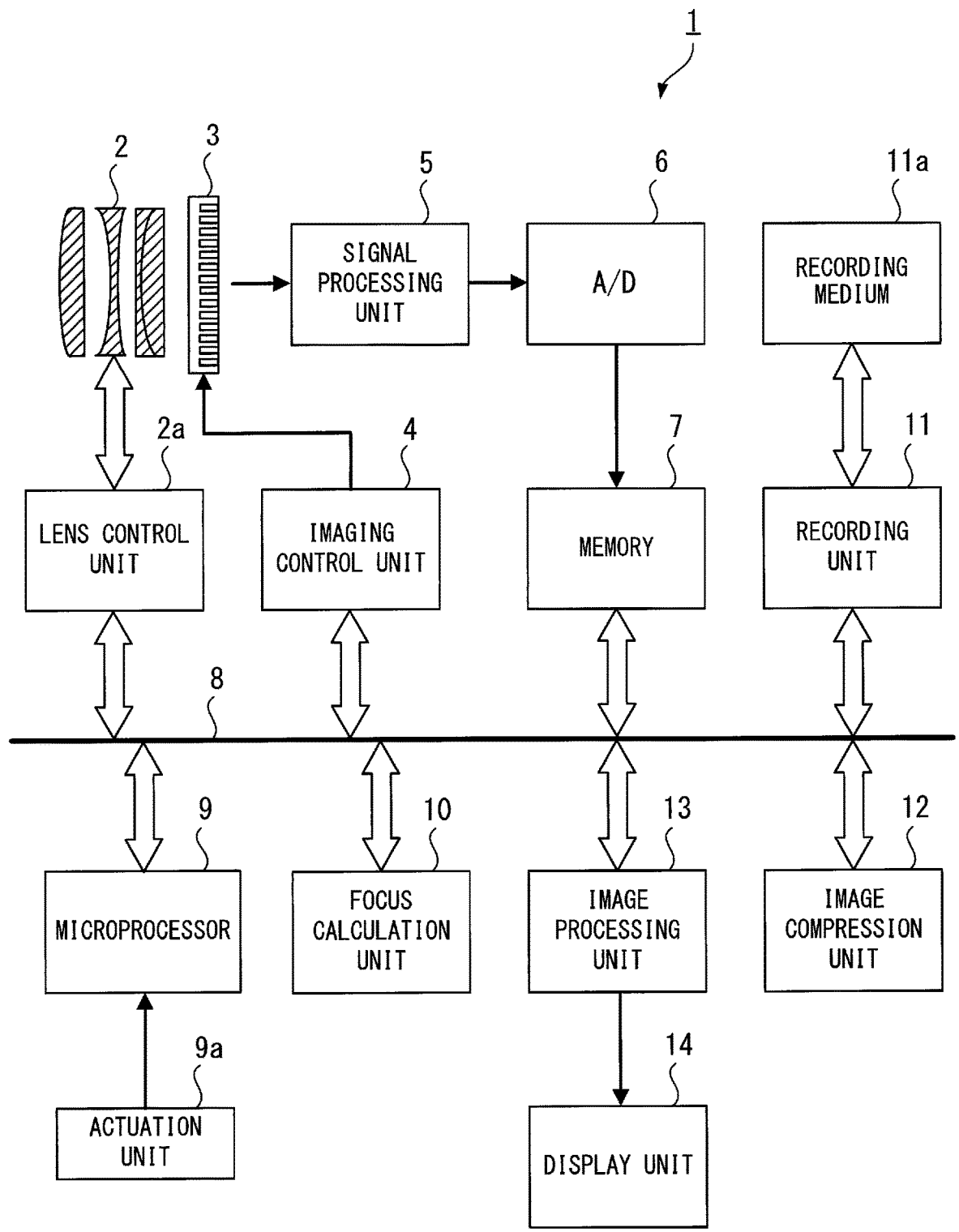
FIG. 1 is a block diagram showing an example of a camera according to a first embodiment.

FIG. 1 is a block diagram showing an example of a digital camera 1 (hereinafter termed the "camera"), that is provided with a focus detection device employing a solid-state image sensor (a solid-state imaging element) 3 (hereinafter termed the "image sensor") according to a first embodiment of the present invention.

In this first embodiment, an example of an interchangeable lens type camera 1 of a single lens reflex type or a mirrorless type is explained, but the camera could also not be of an interchangeable lens type. For example, the camera, which fundamentally is an imaging device (an image-capturing device), may be built as an integrated lens type camera or as a camera mounted to a portable terminal such as a smart phone or the like. Moreover, the camera is not limited to performing still imaging; it could also be built as an imaging device such as a video camera, a mobile camera, or the like that captures video images.

Structure of the Camera

A photographic lens 2 is mounted to the camera 1, and serves as an image capturing optical system. This photographic lens 2 has a focusing lens and an aperture. The focusing lens and the aperture of the photographic lens 2 are controlled by a lens control unit 2a that receives commands from a microprocessor 9. The photographic lens 2 forms an optical image (i.e. an image of the photographic subject) upon the imaging surface of an image sensor 3. The photographic lens 2 is also sometimes termed an "image formation optical system".

The image sensor 3 has a plurality of pixels. As will be described hereinafter, each of the plurality of pixels incorporates two photoelectric conversion units, each of which photoelectrically converts incident light and generates charge. Each of the plurality of pixels photoelectrically converts light that has passed through the photographic lens 2. And each of the plurality of pixels outputs signals based upon the charges that have been generated by photoelectric conversion. The image sensor 3 is controlled by an imaging control unit 4 that receives commands from the microprocessor 9. The signals that are outputted from the plurality of pixels comprised in the image sensor 3 are temporarily stored in a memory 7, after having been processed via a signal processing unit 5 and an A/D conversion unit 6. The lens control unit 2a, the imaging control unit 4, the memory 7, the microprocessor 9, a focus calculation unit (i.e. a focus detection processing unit) 10, a recording unit 11, an image compression unit 12, an image processing unit 13, and so on are connected together by a bus 8.

It should be understood that it would also be acceptable to arrange for the image sensor 3 to include some or all of the signal processing unit 5, the A/D conversion unit 6, and the memory 7. The image sensor 3 could also be made by laminating together at least one of the signal processing unit 5, the A/D conversion unit 6 and the memory 7, and the plurality of pixels.

Actuation signals are inputted to the microprocessor 9 from an actuation unit 9a such as a release button and so on.

The microprocessor 9 sends commands to the various blocks on the basis of these actuation signals, and thereby controls the camera 1.

On the basis of the signals from the pixels included in the image sensor 3, the focus calculation unit 10 calculates the focus adjustment state of the photographic lens 2 according to the pupil-split type phase difference detection method. And, on the basis of signals based upon charges generated by first and second photodiodes PD-1 and PD-2 included in pixels 20 all of which will be described hereinafter, the focus detection unit 10 calculates a focusing position for the focusing lens for focusing an image produced by the photographic lens 2 upon the imaging surface of the image sensor 3. In concrete terms, the amount of deviation of images due to a plurality of ray bundles that have passed through different regions of the pupil of the photographic lens 2 is detected, and a defocusing amount is calculated on the basis of this amount of image deviation that has been detected. This defocusing amount represents the amount of deviation between the image focusing surface at which the image produced by the photographic lens 2 is formed, and the imaging surface of the image sensor 3. Since this calculation of the defocusing amount by the phase difference detection method is per se known, accordingly detailed explanation thereof will be curtailed. The focus calculation unit 10 calculates the amount by which the focusing lens is to be shifted to its focused position on the basis of the defocusing amount that has thus been calculated.

The microprocessor 9 sends the shifting amount of the focusing lens that has thus been calculated to the lens control unit 2a, along with a command for shifting of the focusing lens according thereto. Due to this, focus adjustment is performed automatically. The focus calculation unit 10, the microprocessor 9, and the lens control unit 2a operate as a focus adjustment unit.

The image processing unit 13 performs predetermined image processing upon the signals from the image sensor 13 stored in the memory 7, and thereby generates image data. The image processing unit 13 functions as an image generation unit. After the image processing, the image compression unit 12 compresses the image data according to a predetermined format. And the recording unit 11 records the image data after compression upon a recording medium 11a according to a predetermined file format, and reads out image data recorded upon the recording medium 11a. The recording medium 11a is a memory card or the like that is freely detachable from the recording unit 11.

Moreover, the image processing unit 13 generates image data for displaying an image upon the display unit 14. Thus, the display unit 14 displays an image on the basis of image data generated by the image processing unit 13. An image (which may be a still image or a video image) replayed on the basis of image data recorded upon the recording medium 11a or a monitor image acquired by the image sensor 3 (i.e. a live view image) at predetermined intervals (for example at 60 fps) is included in the image that is displayed upon the display unit 14.

Outline of the Image Sensor

Figure 2:
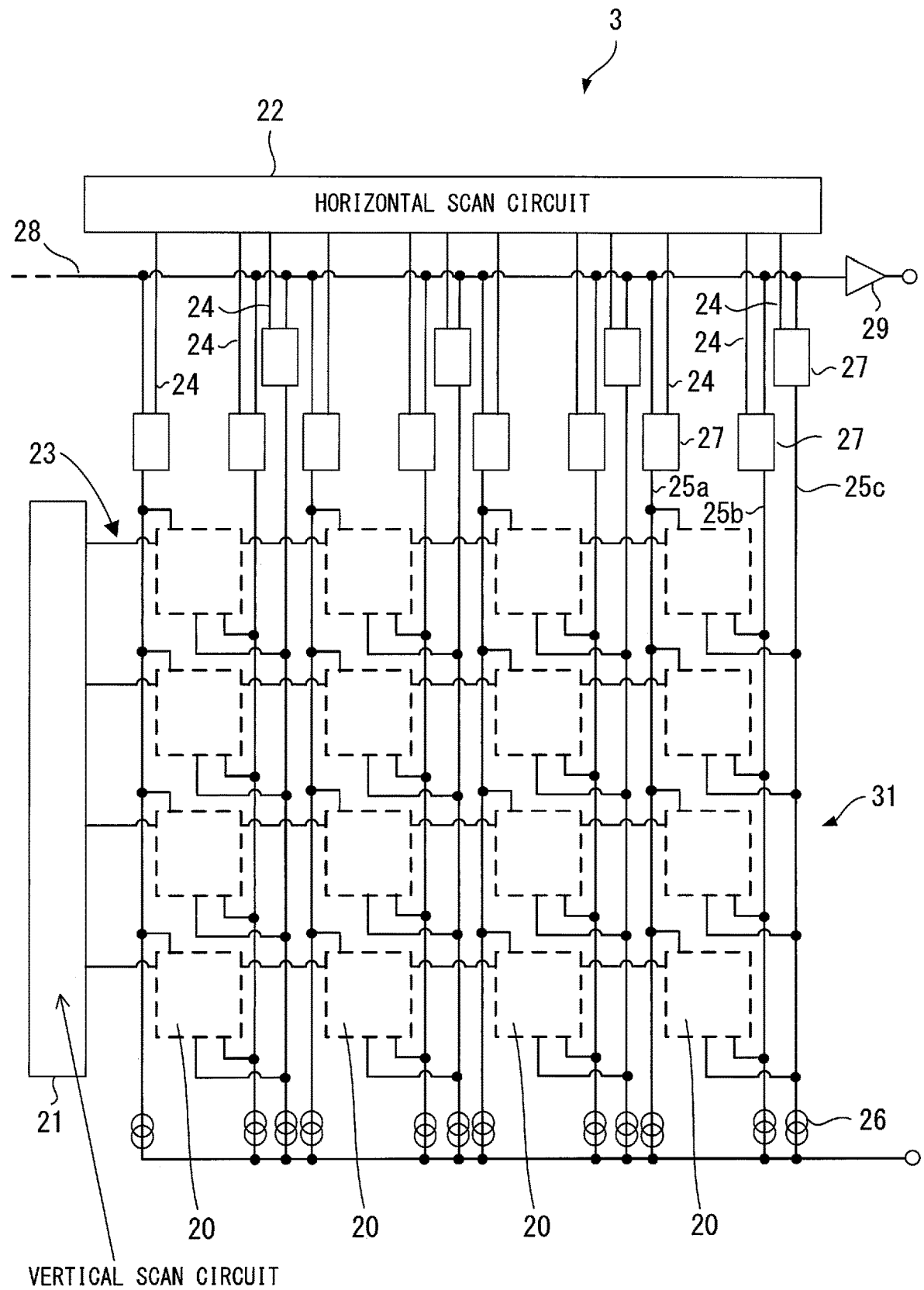
FIG. 2 is a figure showing an example of the general structure of an image sensor.

FIG. 2 is a figure showing an example of the general structure of the image sensor 3. The image sensor 3 includes a plurality of pixels 20 arranged in the form of a matrix, and peripheral circuitry for outputting signals from these pixels 20. Generally the minimum units that make up an image are termed "pixels", but, in this embodiment, the structures that generate signals of the minimum units making up the image are termed "pixels".

An image capture region 31 illustrates a region in which the pixels 20 are arranged in the form of a matrix. In the example of FIG. 2, a range of sixteen pixels, four rows horizontally by four columns vertically, is shown as an example of the image capture region 31, but the actual number of pixels is very much greater than shown in this FIG. 2 example.

Figure 3:
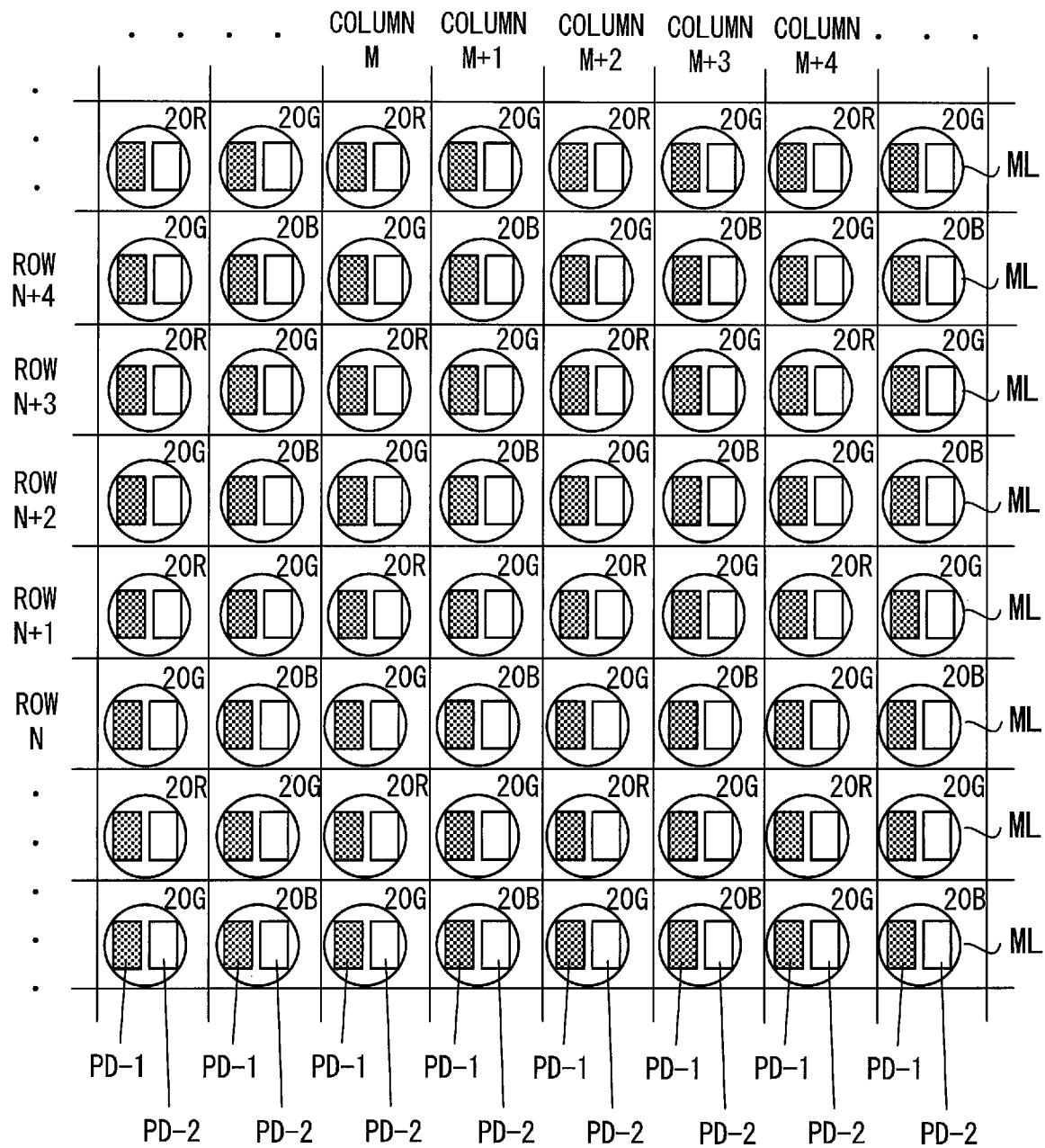
FIG. 3 is a circuit diagram for explanation of an arrangement of pixels on the image sensor.

FIG. 3 is a diagram for explanation of an example of arrangement of pixels upon the image sensor 3. Micro lenses ML and color filters not shown in the figures are provided to the pixels 20. A color filter of one of three types having different spectral characteristics, for example R (red), G (green), and B (blue), is provided to each of the pixels 20. The R color filters principally pass light of the red colored wavelength band. And the G color filters principally pass light of the green colored wavelength band. Moreover, the B color filters principally pass light of the blue colored wavelength band. Due to this, the various pixels 20 have different spectral characteristics, according to the color filters that are provided to them.

A pixel row in which pixels 20 having R and G color filters are disposed alternately (these will hereinafter be referred to as "pixels 20R" and "pixels 20G" respectively), and a pixel row in which pixels 20 having G and B color filters are disposed alternately (these will hereinafter be referred to as "pixels 20G" and "pixels 2B" respectively), are arranged repeatedly in a two dimensional arrangement upon the image sensor 3. In this first embodiment, these pixels 20R, 20G, and 20B are arranged according to a Bayer array.

It should be understood that, in the following explanation, when a reference is made to a "pixel 20" without affixing "R", "G", or "B" thereto, it will be supposed that a pixel of any of the types 20R, 20G, and 20B is meant.

Each of the pixels 20 is provided with two photoelectric conversion units. Generally, if two photoelectric conversion units are provided per each single pixel, there is a case in which the two photoelectric conversion units are arranged along the horizontal direction, in other along the row direction (sometimes this is also expressed as the pixel being "divided horizontally") and there is also a case in which the two photoelectric conversion units are arranged along the vertical direction, in other along the column direction (sometimes this is also expressed as the pixel being "divided vertically"). In this first embodiment, horizontally divided pixels 20 are arranged over the entire area of the image capture region 31. However, instead of horizontally divided pixels 2, it would also be acceptable to arrange to provide vertically divided pixels 20 in a predetermined region. Each of the pixels 20 performs photoelectric conversion with its two photoelectric conversion units according to control signals from its peripheral circuitry, and outputs signals based upon charges generated by the photoelectric conversion.

One of the two photoelectric conversion units of each of the pixels 20 in FIG. 3 is indicated by cross-hatching. The cross-hatched photoelectric conversion units generate first signals that will be described hereinafter on the basis of charges generated by these photoelectric conversion units. Moreover, the photoelectric conversion units that are not cross-hatched generate second signals that will be described hereinafter on the basis of charges generated by these photoelectric conversion units.

According to control signals from the peripheral circuitry, each of the pixels 20 performs photoelectric conversion with its two photoelectric conversion units, and outputs photoelectric conversion signals.

The explanation will now refer again to FIG. 2. For example, the peripheral circuitry may comprise a vertical scan circuit 21, a horizontal scan circuit 22, control signal lines 23 and 24 that are connected thereto, first through third vertical signal lines 25a, 25b, and 25c that receive signals from pixels 20, a constant current source 26 that is connected to the first through third vertical signal lines 25a, 25b, and 25c, correlated double sampling (CDS) circuits 27, a horizontal signal line 28 that receives signals outputted from the CDS circuits 27, an output amp 29, and so on. In this embodiment, three vertical signal lines, in other words first through third vertical signal lines 25a, 25, and 25c, are provided for each single pixel column that consists of a plurality of pixels 20 arranged along the column direction.

The vertical scan circuit 21 and the horizontal scan circuit 22 output predetermined control signals according to commands from the imaging control unit 4. Each of the pixels 20 is driven by control signals outputted from the vertical scan circuit 21, and outputs signals to its first through third vertical signal lines 25a, 25b, and 25c on the basis of charges generated by its photoelectric conversion units. Noise elimination is performed upon these signals outputted from the pixels 20 by the CDS circuits 27, and the results are outputted to the exterior via the horizontal signal line 28 and the output amp 29 according to control signals from the horizontal scan circuit 22.

A Structure Having Two Photodiodes in One Pixel

Figure 4:
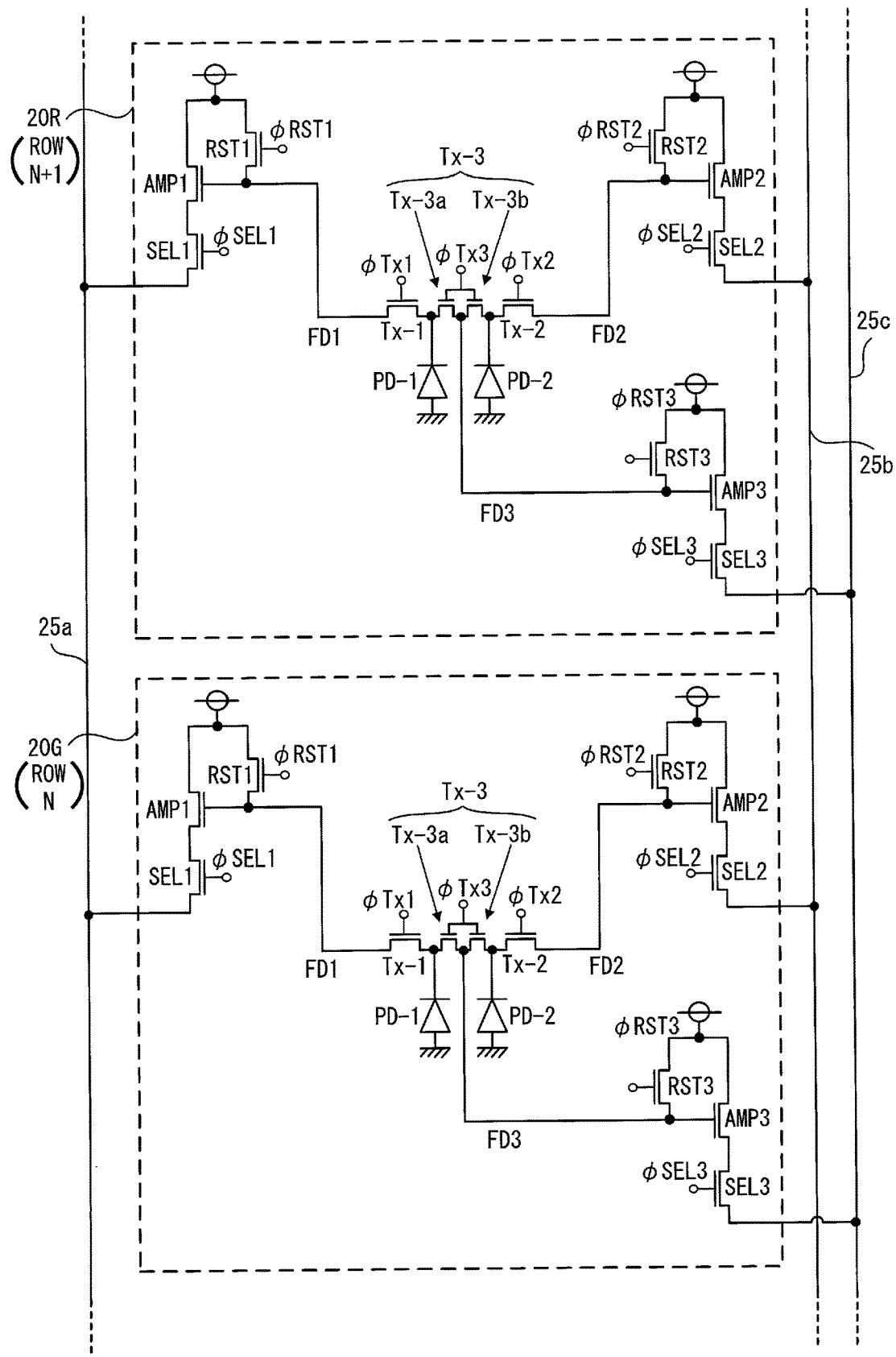
FIG. 4 is a circuit diagram for explanation of pixels arranged in a column M of FIG. 3.

FIG. 4 is a circuit diagram for explanation of pixels 20 arranged in a column M of FIG. 3 (i.e. arranged along the vertical direction), in other words, for example, for explanation of the pixel 20G of the N-th row and the pixel 20R of the (N+1)-th row. Each of the pixels 20 has a micro lens ML, and two photodiodes PD-1 and PD-2 that serve as photoelectric conversion units inside of (i.e. behind) its color filter. In other words, each of the pixels 20 has a first photodiode PD-1 which is disposed on the left side of the pixel 20, and a second photodiode PD-2 which is disposed on the right side of the pixel 20.

Accordingly, ray bundles that have passed through a first region of the pupil of the photographic lens 2 are incident upon the first photodiodes PD-1 of the pixels 20, and ray bundles that have passed through a second region of the pupil of the photographic lens 2 are incident upon the second photodiodes PD-2 of the pixels 20.

In this embodiment, for example, the first photodiode PD-1 and the second photodiode PD-2 and a readout unit that reads out signals based upon the charges generated by the first and second photodiodes PD-1 and PD-2 are collectively termed a "pixel". While an example of such a readout unit that includes transfer transistors, FD regions, amplification transistors, and selection transistors will be explained, the scope of the readout unit is not necessarily limited to this example.

As described above, in each of the pixels 20, light that has passed through different regions of the pupil of the photographic lens 2, in other words light that has passed through first and second regions thereof, is incident upon the first and second photodiodes PD-1 and PD-2. Each of the first and second photodiodes PD-1 and PD-2 photoelectrically converts the light that is incident thereupon and generates charge. The charge generated by the first photodiode PD-1 is transferred to a first FD (floating diffusion) region FD1 via a first transfer transistor Tx-1.

This first FD region FD1 accumulates the charge that it receives, and converts that charge into a voltage. And a signal corresponding to the potential of the first FD region FD1 is amplified by a first amplification transistor AMP1.

The first FD region FD1 and the first amplification transistor AMP1 operate as a first signal generation unit. And the signal of a row that is selected by a first selection transistor SEL1 which selects a row is read out via the first vertical signal line (output unit) 25a. Moreover, a first reset transistor RST1 operates as a resetting unit that resets the potential of the first FD region FD1.

And the charge generated by the second photodiode PD-2 is transferred to a second FD region FD2 via a second transfer transistor Tx-2. This second FD region FD2 accumulates the charge that it receives, and converts that charge into a voltage. And a signal corresponding to the potential of the second FD region FD2 is amplified by a second amplification transistor AMP2. The second FD region FD2 and the second amplification transistor AMP2 operate as a second signal generation unit. And the signal of the row that is selected by a second selection transistor SEL2 which selects a row is read out via the second vertical signal line (output unit) 25b. Moreover, a second reset transistor RST2 operates as a resetting unit that resets the potential of the second FD region FD2.

The image sensor 3 according to this embodiment is also capable of transferring the charge generated by the first photodiode PD-1 and the charge generated by the second photodiode PD-2 together to a third FD region FD3 via a third transfer transistor section Tx-3. This third transfer transistor section Tx-3 comprises a transfer transistor Tx-3a that transfers the charge of the first photodiode PD-1 to the third FD region FD3, and a transfer transistor Tx-3b that transfers the charge of the second photodiode PD-2 to the third FD region FD3.

The third FD region FD3 accumulates charge from the first photodiode PD-1 and PD-2, and converts that charge into a voltage. And a signal corresponding to the potential of the third FD region FD3 is amplified by a third amplification transistor AMP3. The third FD region FD3 and the third amplification transistor AMP3 operate as a third signal generation unit. And the signal of the row that is selected by a third selection transistor SEL3 which selects a row is read out via the third vertical signal line (output unit) 25c. Moreover, a third reset transistor RST3 operates as a resetting unit that resets the potential of the third FD region FD3.

In this first embodiment, for example, a signal (termed the first signal) based upon the charge generated by the first photodiode PD-1 that is disposed on the left side of the pixel 20 which is horizontally divided, a signal (termed the second signal) based upon the charge generated by the second photodiode PD-2 that is disposed on the right side of the pixel 20, and a signal (termed the third signal) based upon the sum of the charge generated by the first photodiode PD-1 and the charge generated by the second photodiode PD-2 are respectively read out via the first through third vertical signal lines 25a, 25b, and 25c, which are all different.

The Control Signals

In the pixel 20, when the charge generated by the first photodiode PD-1 is to be transferred to the first FD region FD1, the first transfer transistor Tx-1 is turned ON by a first control signal φTx1. And, when the charge generated by the second photodiode PD-2 is to be transferred to the second FD region FD2, the second transfer transistor Tx-2 is turned ON by a second control signal φTx2. Moreover, when the charge generated by the first photodiode PD-1 and the charge generated by the second photodiode PD-2 are to be transferred together to the third FD region FD3, the third transfer transistor section Tx-3 is turned ON by a third control signal φTx3. In other words, the transfer transistors Tx-3a and Tx-3b of the third transfer transistor section Tx-3 are both simultaneously turned ON by the third control signal φTx3.

The first selection transistor for row selection SEL1 is turned ON by a first control signal φSEL1 when the first signal is to be outputted to the first vertical signal line (output unit) 25a. The second selection transistor for row selection SEL2 is turned ON by a second control signal φSEL2 when the second signal is to be outputted to the second vertical signal line (output unit) 25b. And the third selection transistor for row selection SEL3 is turned ON by a third control signal φSEL3 when the third signal is to be outputted to the third vertical signal line (output unit) 25c.

The first reset transistor RST1 is turned ON by a first control signal φRST1 when the potential of the first FD region FD1 is to be reset. The second reset transistor RST2 is turned ON by a second control signal φRST2 when the potential of the second FD region FD2 is to be reset. And the third reset transistor RST3 is turned ON by a third control signal φRST3 when the potential of the third FD region FD3 is to be reset.

Figure 5:
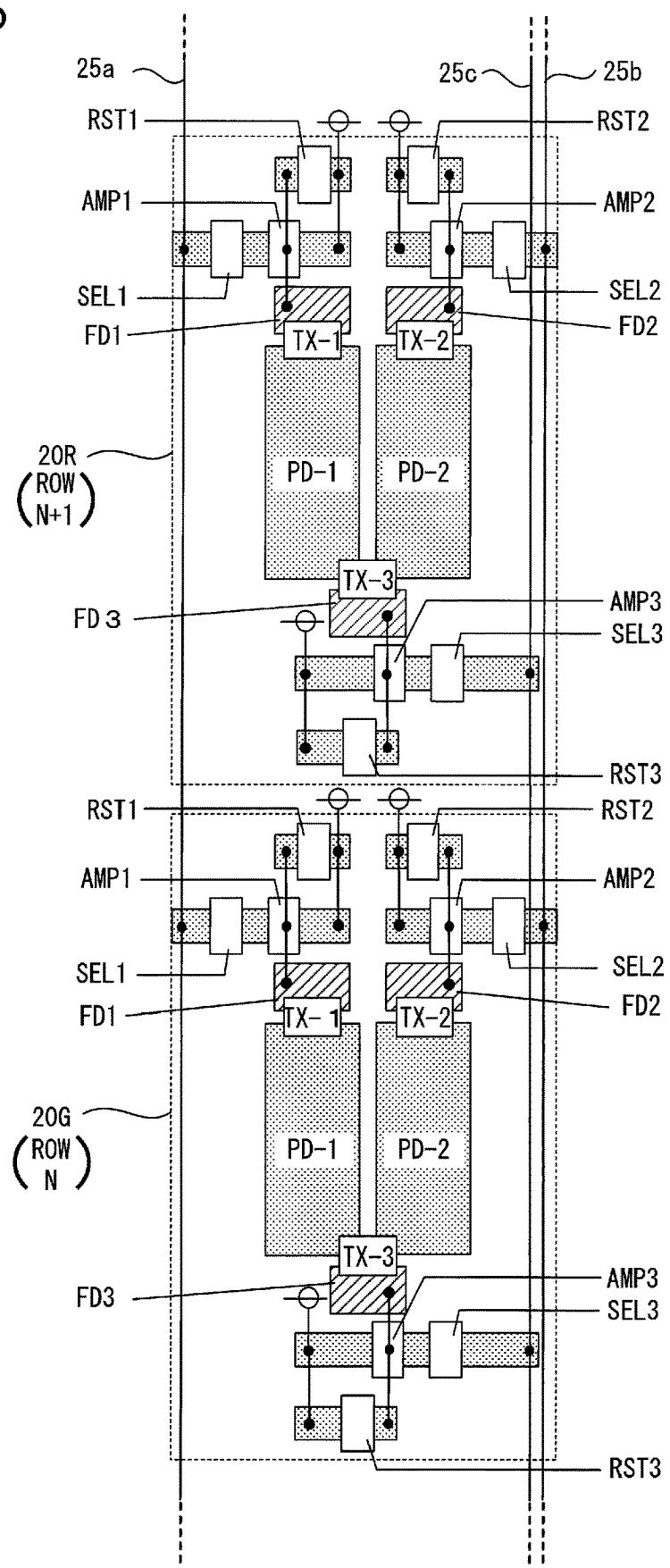
FIG. 5 is a figure for explanation of the pixel layout of FIG. 4.

FIG. 5 is a figure for explanation of the layout of the pixels 20G and 20R corresponding to the circuit diagram of FIG. 4. It should be understood that the wiring for the first through third control signals φTx1 through φTx3, the first through third control signals φRST1 through φRST3, and the wiring for the first through third control signals φSEL1 through φSEL3 is omitted in the figure.

In FIG. 5, the first and second FD regions FD1 and FD2 are lined up from the left to the right, with the first FD region FD1 being disposed at one edge of the first photodiode PD-1 while the second FD region FD2 is disposed at the same edge of the second photodiode PD-2. And the third FD region FD3 is disposed at the other edges of the first and second photodiodes PD-1 and PD-2. Moreover, the areas of the first photodiode PD-1 and the second photodiode PD-2 which are arranged on the left and right edges of the pixel 20 are approximately the same. Furthermore, in this embodiment, the area of the gate oxide of the first transfer transistor Tx-1 and the area of the first FD region FD1, whose relationships with the electrostatic capacitance (hereinafter simply termed the "capacitance") of the first FD region FD1 are strong, are respectively approximately equal to the area of the gate oxide of the second transfer transistor Tx-2 and the area of the second FD region FD2, whose relationships with the capacitance of the second FD region FD2 are strong.

Even further, in this embodiment, the area of the gate oxide of the third transfer transistor section Tx-3 and the area of the third FD region FD3, whose relationships with the capacitance of the third FD region FD3 are strong, are respectively approximately equal to the area of the gate oxide of the first transfer transistor Tx-1 and the area of the first FD region FD1, or to the area of the gate oxide of the second transfer transistor Tx-2 and the area of the second FD region FD2.

Since, in this manner, the three sets of transfer transistors and FD regions described above are formed via the same process, accordingly the capacitances of the three FD regions FD1 through FD3 become approximately the same.

Since, as described above, in the pixels 20, it is arranged for the areas of the first and second photodiodes PD-1 and PD2 to be approximately the same, accordingly the amounts of charge that they generate per unit amount of incident light (i.e. their photoelectric conversion efficiencies) are approximately the same. For example, if the same amounts of light are incident upon the first and second photodiodes PD-1 and PD-2, then the amounts Q of charge generated by the first and second photodiodes PD-1 and PD-2 become approximately equal. Accordingly, the amounts Q of charge transferred to the first FD region FD1 and to the second FD region FD2 from the first and second photodiodes PD-1 and PD-2 respectively become approximately equal. Moreover, if different amounts of light are incident upon the first and second photodiodes PD-1 and PD-2, then respectively different amounts of charge are generated on the basis of these amounts of light incident upon the first and second photodiodes PD-1 and PD-2. Accordingly, these different charge amounts generated by the first and second photodiodes PD-1 and PD-2 are respectively transferred to the first FD region FD1 and to the second FD region FD2.

Furthermore, since the relationship [potential difference $V=Q/C$] holds, accordingly, due to the fact that the capacitance C of the first FD region FD1 and the capacitance C of the second FD region FD2 are approximately equal, the conversion efficiencies (i.e. the efficiencies of signal generation) of conversion to voltages (signals) per unit charge amount are approximately equal. For example, if approximately equal charge amounts Q are generated by the first and second photodiodes PD-1 and PD-2, then the magnitudes of the signals respectively generated by the first signal generation unit and by the second signal generation unit also become approximately equal. Moreover, if different charge amounts Q are generated by the first and second photodiodes PD-1 and PD-2, then different signals based upon these different charge amounts are respectively generated by the first signal generation unit and by the second signal generation unit. This implies that the efficiencies of signal generation by the first signal generation unit and by the second signal generation unit become approximately the same, and variation in the efficiency of signal generation is suppressed. The fact that the photoelectric conversion efficiencies of the first and second photodiodes PD-1 and PD-2 are approximately equal, and the fact that the signal generation efficiencies of the first signal generation unit and the second signal generation unit are approximately equal, imply that the conversion gains during photoelectric conversion are approximately equal.

Furthermore, in this embodiment, since the capacitance C of the third FD region FD3 in the third signal generation unit is also approximately the same as the capacitance C of the first FD region FD1 in the first signal generation unit (and as the capacitance C of the second FD region FD2 in the second signal generation unit), accordingly the efficiencies of signal generation by the third signal generation unit and by the first signal generation unit (and by the second signal generation unit) also become approximately the same, and variation in the efficiency of signal generation is suppressed.

The fact that the photoelectric conversion efficiencies of the first and second photodiodes PD-1 and PD-2 are approximately equal, and the fact that the signal generation efficiencies are approximately equal between the third signal generation unit and the first signal generation unit, imply that the conversion gains of the first signal generation unit through the third signal generation unit during photoelectric conversion are all approximately equal.

Accordingly, for example, if as described above the same amounts of light are incident upon the first and second photodiodes PD-1 and PD-2, then the magnitude of the signal generated by the third signal generation unit is approximately twice that of the signal generated by the first signal generation unit (and of the signal generated by the second signal generation unit).

In general, when the area of an FD region becomes greater, its capacitance becomes greater, and its efficiency of signal generation decreases (or, to put it in another manner, the conversion gain decreases). However, in this embodiment, due to the fact that the area of the gate oxide of the third transfer transistor section Tx-3 and the area of the third FD region FD3 are respectively made to be approximately the same as the area of the gate oxide of the first transfer transistor Tx-1 and the area of the first FD region FD1, accordingly the conversion gain of the third signal generation unit is approximately equal to the conversion gain of the first signal generation unit. Moreover, the conversion gain of the first signal generation unit is also approximately equal to the conversion gain of the second signal generation unit.

Due to the above, it is possible to prevent the conversion gain when reading out and adding the signals based upon the charges generated by the first photodiode PD-1 and the second photodiode PD-2 from decreasing, as compared to the case when the signals based upon the charges generated by the first photodiode PD-1 or the second diode PD-2 are read out individually.

Explanation of the Time Chart

Figure 6:
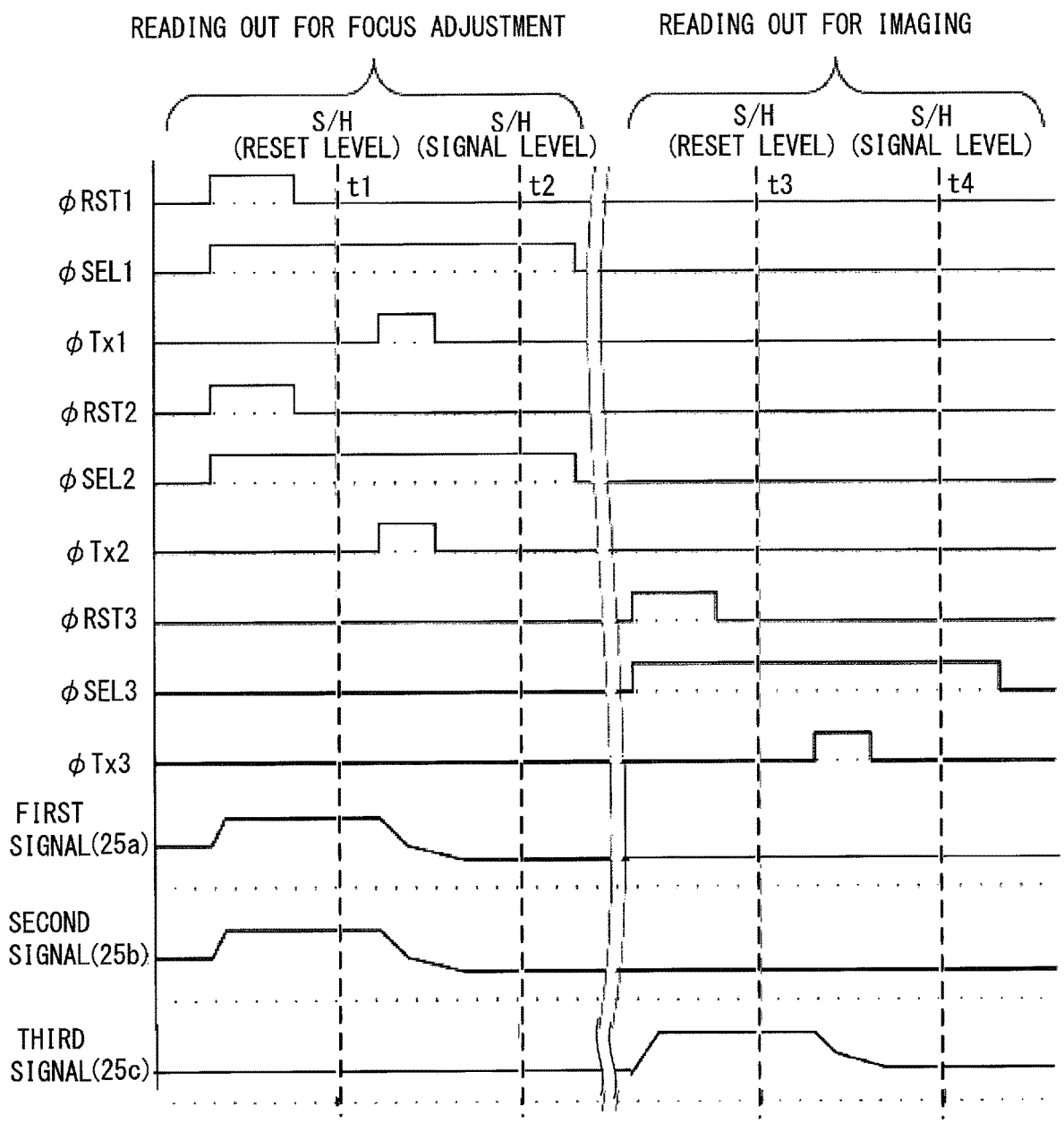
FIG. 6 is a figure for explanation of control signals of various types supplied to the image sensor.

FIG. 6 is a time chart for explanation of control signals of various types that are supplied to the image sensor 3. During an interval in which the first signal and the second signal are read out individually (i.e. the reading out interval for focus adjustment of FIG. 6), both the first and second control signals φSEL1 and φSEL2 are supplied at H level simultaneously to the first selection transistor SEL1 and to the second selection transistor SEL2 respectively in order to perform focus adjustment. Due to this, the first selection transistor SEL1 that causes the first signal to be outputted and the second selection transistor SEL2 that causes the second signal to be outputted are turned ON simultaneously. Moreover, due to a reset pulse at H level being supplied as the first control signal φRST1 the first reset transistor RST1 is turned ON and the potential of the first FD region FD1 is reset. In a similar manner, due to a reset pulse at H level being supplied as the second control signal φRST2, the second reset transistor RST2 is turned ON and the potential of the second FD region FD2 is reset. At the time point indicated by the broken line t1, the first signal and the second signal both at reset level, are read out via the first and second vertical signal lines 25a and 25b respectively.

Next, by a transfer pulse at H level being supplied as the first control signal φTx1, the first transfer transistor Tx-1 is turned ON and the charge generated by the first photodiode PD-1 is transferred to the first FD region FD1. And, simultaneously with this supply of the first control signal φTx1, by a transfer pulse at H level being supplied as the second control signal φTx2, the second transfer transistor Tx-2 is turned ON and the charge generated by the second photodiode PD-2 is transferred to the second FD region FD2. Due to this, at the time point indicated by the broken line t2, the first signal and of the second signal both at signal level, are read out via the first and second vertical signal lines 25a and 25b respectively.

Then, in an interval in which reading out of signals based upon the charges generated by the first photodiode PD-1 and the second photodiode PD-2 is performed while the signals are added together (i.e. the interval for image reading out in FIG. 6), a third control signal φSEL3 at H level is supplied to the third selection transistor SEL3 in order to generate image data. Due to this, the third selection transistor SEL3 that causes the third signal to be outputted is turned ON. Moreover, due to a reset pulse at H level being supplied as the third control signal φRST3, the third reset transistor RST3 is turned ON and the potential of the third FD region FD3 is reset. And, at the time point indicated by the broken line t3, the third signal at reset level is read out via the third vertical signal line 25c.

Next, by a transfer pulse at H level being supplied as the third control signal φTx3, the third transfer transistor section Tx-3 is turned ON and the charge generated by the first photodiode PD-1 and the charge generated by the second photodiode PD-2 are transferred to the third FD region FD3. Due to this, at the time point indicated by the broken line t4, the third signal at signal level is read out via the third vertical signal line 25c.

Focus Adjustment

The camera 1 of this embodiment generates a pair of focus detection signals to be employed for focus detection, which are, for example, read out from a pixel row included in a focusing area, and which are generated on the basis of the first signals and the second signals of pixels 20G. The focusing area is an area over which the focus calculation unit 10 detects the amount of image deviation as phase difference information, and may also be termed the "focus detection area", the "range-finding point", or the "auto focus (AF) point".

When, for example, an actuation signal that indicates that half press actuation of the release button has been performed is inputted from the actuation unit 9a, the microprocessor 9 issues a command to the imaging control unit 4 for performing image capture for focus adjustment. And, in this image capture for focus adjustment, control signals for performing reading out for focus adjustment are supplied from the vertical scan circuit 21 and from the horizontal scan circuit 22 to the pixel row of the image sensor 3 that is to be the subject of being read out, so that reading out for focus adjustment is performed. In this reading out for focus adjustment, along with supplying the first control signals φTx1 and so on to the pixels 20G of the pixel row and reading out the first signals from the first photodiodes PD-1 of the pixels 20G, the second control signals φTx2 and so on are supplied to the pixels 20G and the second signals are read out from the second photodiodes PD-2 of the pixels 20G.

Due to this reading out for focus adjustment, the first signals and the second signals that have been read out from the pixels 20G of the pixel row to which the first and second control signals φTx1 and φTx2 have been supplied are stored in the memory 7. A plurality of first signals A1, A2, . . . An (also sometimes termed the signals of group "a") and a plurality of second signals B1, B2, Bn (also sometimes termed the signals of group "b") represent the intensity distributions of images due to a plurality of ray bundles that have passed through different regions of the pupil of the photographic lens 2.

Figure 7:
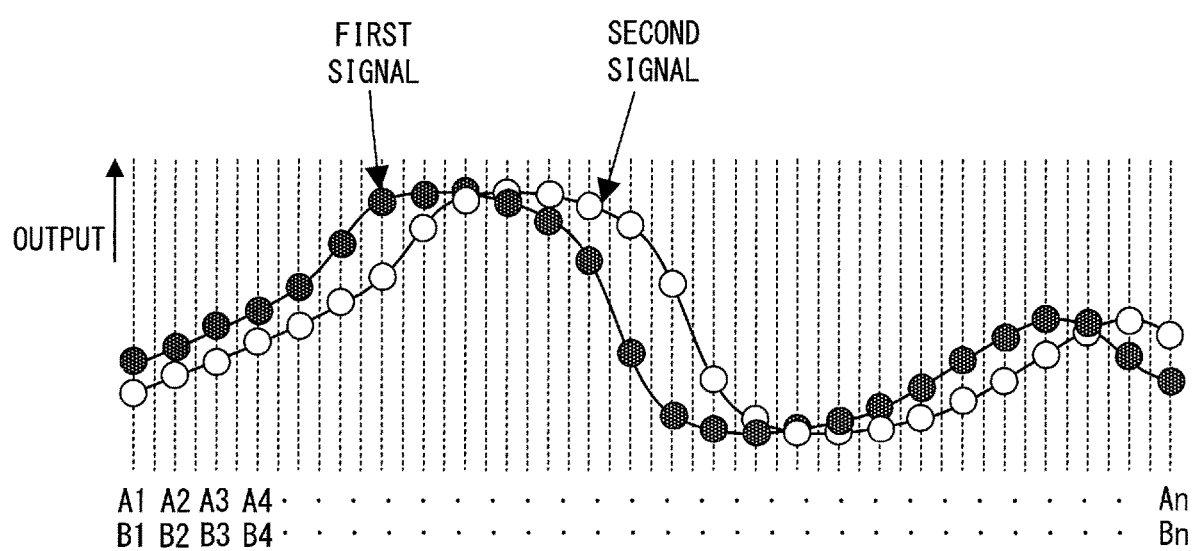
FIG. 7 is a figure showing examples of group "a" signals and group "b" signals.

FIG. 7 is a figure showing examples of a plurality of first signals in the group "a" and a plurality of second signals in the group "b". In FIG. 7, then signals in the group "a" are represented by shaded circles. Moreover, the n signals in the group "b" are represented by white circles. The signals of group "a" and the signals of group "b" from the pixels 20G are read out for every other column of FIG. 3, respectively. The vertical dotted lines in FIG. 7 correspond to the pixel columns.

On the basis of the signals of group "a" and the signals of group "b" described above, the focus calculation unit 10 calculates the amount of image deviation of a plurality of images by performing image deviation detection calculation processing (i.e. correlation calculation processing and phase difference detection processing), and calculates a defocusing amount by multiplying the amount of image deviation by a predetermined conversion coefficient.

Next, the microprocessor 9 makes a decision as to whether or not the defocusing amount that has thus been calculated by the focus calculation unit 10 is within a permitted value. If the defocusing amount exceeds the permitted value, then the microprocessor 9 decides that the focused state is not appropriate, and sends a lens shifting command to the lens control unit 2a. And the lens control unit 2a shifts the focusing lens to a position (the focused position) that brings the defocusing amount within the permitted value. On the other hand, if the defocusing amount is within the permitted value, then the microprocessor decides that the focused state is appropriate, and does not send any lens shifting command.

Moreover, if focus adjustment is performed while a monitor image is being displayed upon the display unit 14, then the imaging control unit 4 is able to have the image sensor 3 alternately perform reading out for focus adjustment, and reading out for imaging that will be described hereinafter; for example, image sensor 3 is capable of performing these processes alternately for each pixel row. And in this case, for example, after the reading out for focus adjustment has been performed from a pixel row that is the subject for reading out for focus adjustment, the microprocessor 9 starts image deviation detection calculation processing on the basis of the signals of group "a" and the signals of group "b" that are stored in the memory 7.

On the other hand, in the reading out for imaging, the reading out for imaging is performed by supplying control signals for performing reading out for imaging from the vertical scan circuit 21 and the horizontal scan circuit 22 to the pixel row of the image sensor 3 that is to be the subject of being read out. This reading out for imaging consists of supplying the control signals φTx3 and so on to the pixels 20G of the pixel row and reading out the third signals. As described above, the third signal is a signal for generating image data on the basis of the sum of the charge generated by the first photodiode PD-1 and the charge generated by the second photodiode PD-2. The image processing unit 13 generates image data for displaying a monitor image upon the display unit 14 by performing predetermined image processing upon the third signals stored in the memory 7 by the reading out for imaging.

In this manner, when display of the monitor image is being performed while the camera 1 is performing focus adjustment, the imaging control unit 4 repeatedly performs the above described reading for focus adjustment and the above described reading out for imaging.

It should be understood that, with the camera 1 described above, the image data that is employed for focus adjustment is generated on the basis of first signals and second signals from pixels 20G that have been read out from a pixel row that is included in the focusing area. However, the image data that is employed for focus adjustment is not limited to being generated from the first signals and the second signals from pixels 20G; it would also be acceptable to generate the image data on the basis of first signals and second signals from pixels 20R, and it would also be acceptable to generate the image data on the basis of first signals and second signals from pixels 20B.

Generation of the Image Data

The camera 1 of this embodiment generates image data related to an image of the photographic subject on the basis of the third signals that are read out from the pixels 20 of the image capture region 31 (refer to FIG. 2). For example, when an actuation signal is inputted from the actuation unit 9a indicating that full press actuation of the release button has been performed, then the microprocessor 9 commands the imaging control unit 4 to capture an image for recording. In this capture of an image for recording, control signals are supplied from the vertical scan circuit 21 and from the horizontal scan circuit 22 to each pixel row of the image sensor 3, and thereby imaging for reading out is performed. In concrete terms, third control signals φTx3 and so on are supplied to each of the pixels 20 of the pixel row, and due thereto third signals are read out from the pixels 20.

The third signals that have been read out from the pixels 20 by the reading out for imaging in this manner are stored in the memory 7. The image processing unit 13 performs tone processing and color interpolation processing and so on upon the third signals that are stored in the memory 7, and thereby generates image data for recording.

According to the first embodiment as explained above, the following operations and beneficial effects are obtained.

(1) The image sensor 3 is provided with a plurality of pixels 20 each comprising: a first photodiode PD-1 that performs photoelectric conversion upon light that has passed through the micro lens ML and generates charge; a second photodiode PD-2 that performs photoelectric conversion upon light that has passed through the micro lens ML and generates charge; a first FD region FD1 that accumulates charge generated by the first photodiode PD-1; a second FD region FD2 that accumulates charge generated by the second PD-2; a third FD region FD3 that accumulates charge generated by the first photodiode PD-1 and charge generated by the second photodiode PD-2; a first transfer transistor Tx-1 that transfers charge generated by the first photodiode PD-1 to the first FD region FD1; a second transfer transistor Tx-2 that transfers charge generated by the second photodiode PD-2 to the second FD region FD2; and a third transfer transistor section Tx-3 that transfers charge generated by the first photodiode PD-1 and charge generated by the second photodiode PD-2 to the third FD region FD3.

Due to this, it is possible to read out from the pixels 20 the first signals that are based upon the charges generated by the first photodiodes PD-1 and the second signals that are based upon the charges generated by the second photodiodes PD-2 either individually, or alternatively both together, as appropriate.

(2) Since the third FD region FD3 of (1) described above accumulates a charge that is the sum of the charge generated by the first photodiode PD-1 and the charge generated by the second photodiode PD-2, accordingly it is possible to read out, as a single signal, the third signal that is based upon the sum of the charges generated by the first and second photodiodes PD-1 and PD-2.

(3) In (1) described above, the difference between the capacitance of the first FD region FD1 and the capacitance of the second FD region FD2 is less than a value determined in advance, and moreover the difference between the capacitance of the first FD region FD1 or the capacitance of the second FD region FD2 and the capacitance of the third FD region FD3 is less than a value determined in advance. Due to this, the capacitances of the three FD regions FD1 through FD3 described above become approximately equal, so that it becomes possible to make the conversion gains during photoelectric conversion by the first through third signal generation units become approximately equal. By making the conversion gains be approximately equal, deterioration of the accuracy of focus adjustment based upon the signals that are generated can be suppressed. Moreover, reduction of the quality of the image based upon the image data that is generated can be suppressed.

(4) Since, in the image sensor 3 described above, each of the pixels 20 comprises the first vertical signal line 25a that outputs the first signal on the basis of the charge accumulated in the first FD region FD1, the second vertical signal line 25b that outputs the second signal on the basis of the charge accumulated in the second FD region FD2, and the third vertical signal line 25c that outputs the third signal on the basis of the charge accumulated in the third FD region FD3, accordingly it is possible for the first signal through the third signal to be individually read out from the first through third signal generation units described above.

(5) In the image sensor 3 of (4) described above, in at least one of the plurality of pixels 20, along with a first signal based upon charge accumulated in the first FD region FD1 being outputted from the first vertical signal line 25a, a second signal based upon charge accumulated in the second FD region FD2 is outputted from the second vertical signal line 25b; and, in at least one of the plurality of pixels 20, a third signal based upon charge accumulated in the third FD region FD3 is outputted from the third vertical signal line 25c. Due to this, for example, at least one of the plurality of pixels 20 outputs a third signal based upon the charge accumulated in the third FD region FD3 to the third vertical signal line 25c. And due to this, for example, it is possible to perform both reading out for focus adjustment and reading out for imaging for each pixel row.

(6) In the image sensor 3 of (4) or (5) described above, the difference between the efficiency of generation of the first signal by the first signal generation unit outputted from the first vertical signal line 25a and the efficiency of generation of the second signal by the second signal generation unit outputted from the second vertical signal line 25b is less than a value determined in advance, and moreover the difference between the efficiency of generation of the first signal by the first signal generation unit or the efficiency of generation of the second signal by the second signal generation unit, and the efficiency of generation of the third signal by the third signal generation unit outputted from the third vertical signal line 25c is less than a value determined in advance. Due to this, it is possible to make the conversion gains of the first through third signal generation units described above during photoelectric conversion to be approximately equal. By making the conversion gains to be approximately equal, deterioration of the accuracy of focus adjustment based upon the signals that are generated can be suppressed. Moreover, reduction of the quality of the image based upon the image data that is generated can be suppressed.

The following variants also come within the scope of the present invention; and it would also be possible to combine one or more of the following variant embodiments with the embodiment described above.

The First Variant of the First Embodiment

In a first variant of the first embodiment, the third signal based upon the sum of the charge generated by the first photodiode PD-1 and the charge generated by the second photodiode PD-2 is read out via the first vertical signal line 25a or via the second vertical signal line 25b.

Figure 8:
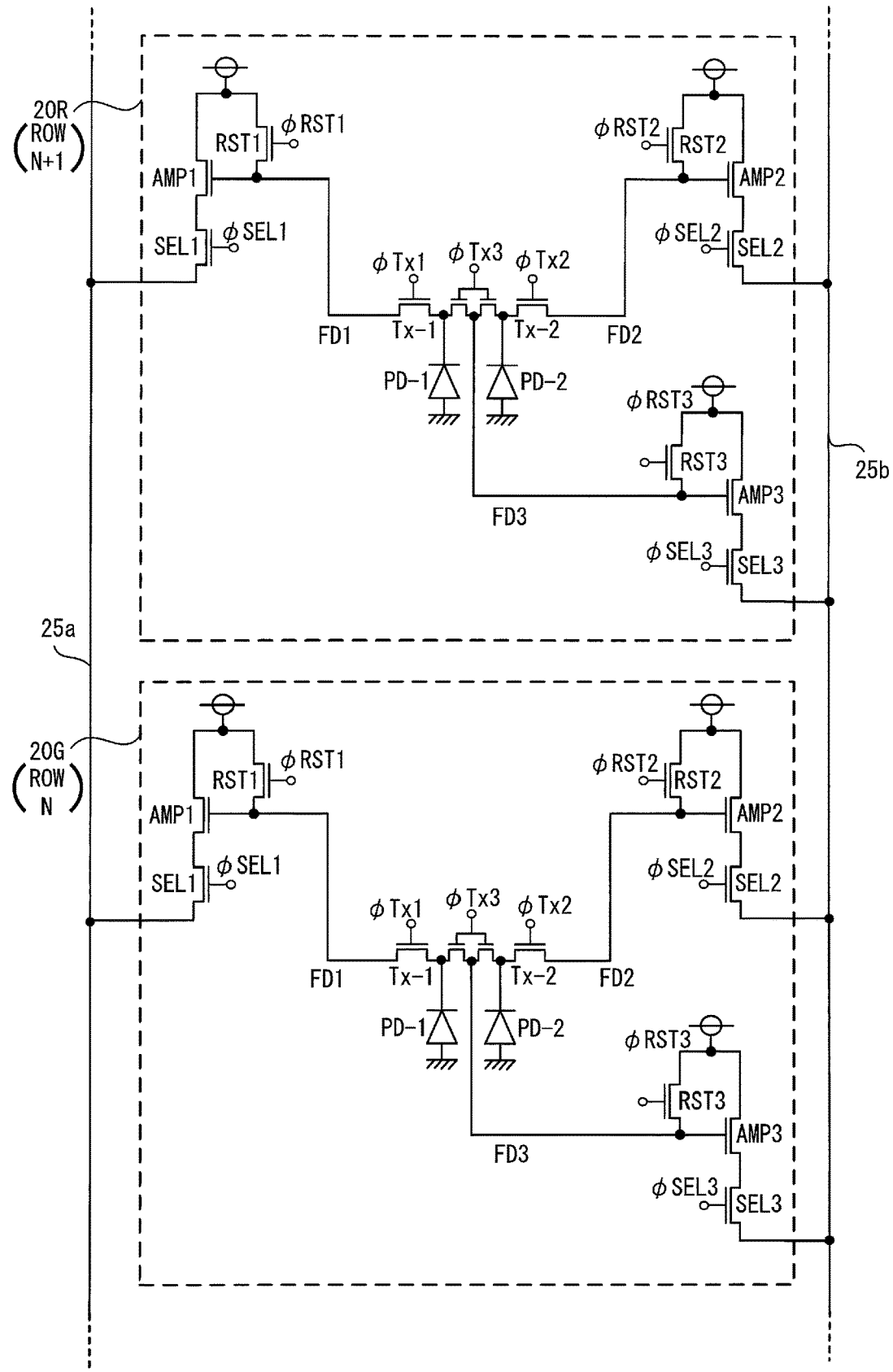
FIG. 8 is a circuit diagram for explanation of pixels arranged in a column M of a first variant of the first embodiment.

FIG. 8 is a circuit diagram for explanation of pixels 20 arranged in a column M of FIG. 3 (i.e. arranged along the vertical direction) in this first variant of the first embodiment, in other words, for example, for explanation of the pixel 20G of the N-th row and the pixel 20R of the (N+1)-th row. The same reference symbols are appended to elements and structures that are the same as in FIG. 4, and explanation thereof is omitted.

In FIG. 8, the difference from the first embodiment (refer to FIG. 4) is that, the third signal, whose selection is performed by the third selection transistor SEL3 that selects the row, is read out via the second vertical signal line (output unit) 25b, instead of being read out via the third vertical signal line (output unit) 25c. It is possible to reduce the amount of wiring by reading out both the third signal and the second signal via the same second vertical signal line (output unit) 25b. Due to this, it is possible to make the areas of the first photodiode PD-1 and the second photodiode PD-2 larger. And, because of this, it is possible to enhance the aperture ratio of this image sensor 3.

It should be understood that although, for this first variant of the first embodiment, an example has been explained in which the third signal is read out via the same second vertical signal line (output unit) 25b as the second signal, it would also be acceptable to provide a structure in which the third signal is read out via the same first vertical signal line (output unit) 25a as the first signal.

Alternatively, it would also be acceptable to arrange to provide a structure in which in the same pixel column, for example in the odd numbered rows, the third signal is read out via the second vertical signal line (output unit) 25b which is the same as that for the third signal, and in the even numbered rows the third signal is read out via the first vertical signal line (output unit) 25a which is the same as that for the first signal. By, for example, the output units being different for each pixel row and the next, it is possible to read out the third signals from pixels of even numbered rows and from pixels of odd numbered rows simultaneously. Furthermore, it is also possible to suppress bias in the numbers of the third selection transistors SEL3 that are connected to the first vertical signal line (output unit) 25a and to the second vertical signal line (output unit) 25b. As a result, it is possible to prevent deterioration of the reading out speed for that vertical signal line whose parasitic capacitance is the larger due to biasing of the parasitic capacitance of the first vertical signal line (output unit) 25a and the parasitic capacitance of the second vertical signal line (output unit) 25b.

To cite a specific example, one of a pair of adjacent pixels 20 will output a third signal based upon the charge accumulated in its third FD region FD3 to the second vertical signal line 25b, while the other one of the pair of adjacent pixels 20 will output a third signal based upon the charge accumulated in its third FD region FD3 to the first vertical signal line 25a.

Explanation of the Time Chart

Figure 9:
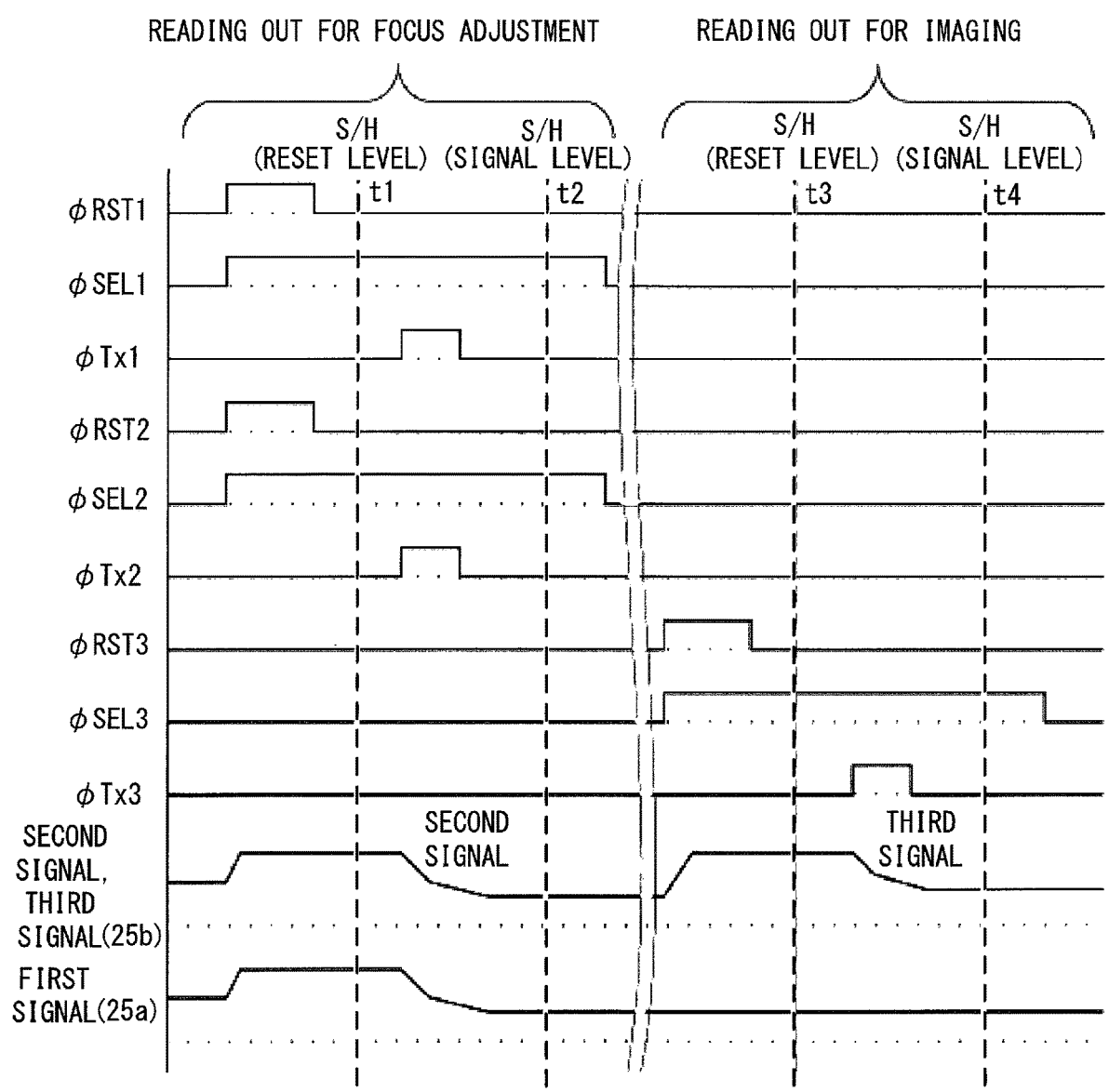
FIG. 9 is a figure for explanation of control signals of various types supplied to this image sensor.

FIG. 9 is a time chart for explanation of control signals of various types supplied to this image sensor of the first variant of the first embodiment. In a similar manner to the case with the first embodiment (refer to FIG. 6), in the interval in which reading out for focus adjustment is performed, first and second control signals φSEL1 and φSEL2 at H level are supplied to the first selection transistor SEL1 and to the second selection transistor SEL2 respectively. Due to this, the first selection transistor SEL1 that causes the first signal to be outputted and the second selection transistor SEL2 that causes the second signal to be outputted are both turned ON. Moreover, by a reset pulse at H level being supplied as the first control signal φRST1, the first reset transistor RST1 is turned ON and the potential of the first FD region FD1 is reset. In a similar manner, by a reset pulse at H level being supplied as the second control signal φRST2, the second reset transistor RST2 is turned ON and the potential of the second FD region FD2 is reset. At the time point shown by the broken line t1, a first signal and a second signal that are both at reset level are read out via the first and second vertical signal lines 25a and 25b respectively.

Next, by a transfer pulse at H level being supplied as the first control signal φTx1, the first transfer transistor Tx-1 is turned ON and the charge that has been generated by the first photodiode PD-1 is transferred to the first FD region FD1. In a similar manner, by a transfer pulse at H level being supplied as the second control signal φTx2, the second transfer transistor Tx-2 is turned ON and the charge that has been generated by the second photodiode PD-2 is transferred to the second FD region FD2. Due to this, at the time point shown by the broken line t2, a first signal and a second signal at signal level are read out via the first and second vertical signal lines 25a and 25b respectively.

The operation for reading out for focus adjustment described above is the same as the operation for reading out for focus adjustment shown in FIG. 6.

In the interval in which reading out for imaging is performed, the third selection transistor SEL3 is turned ON by a third control signal φSEL3 at H level being supplied. Moreover, by a reset pulse at H level being supplied as the third control signal φRST3, the third reset transistor RST3 is turned ON and the potential of the third FD region FD3 is reset. And, at the time point shown by the broken line t3, a third signal that is at reset level is read out via the second vertical signal line 25b.

Next, by a transfer pulse at H level being supplied as the third control signal φTx3, the third transfer transistor section Tx-3 is turned ON and the charge that has been generated by the first photodiode PD-1 and the charge that has been generated by the second photodiode PD-2 are both transferred to the third FD region FD3. Due to this, at the time point shown by the broken line t4, a third signal at signal level is read out via the second vertical signal line 25b.

In this manner, it is possible to read out the third signal via the second vertical signal line (output unit) 25b, which is the same signal line as that employed for the second signal.

According to this first variant of the first embodiment explained above, the following operations and beneficial effects are obtained. That is, since in the image sensor 3 the third vertical signal line 25c is common with the first vertical signal line 25a or the second vertical signal line 25b, accordingly it is possible to reduce the amount of wiring. And, due to this, it is possible to enhance the aperture ratio of the image sensor 3.

The Second Variant of the First Embodiment

Figure 10:
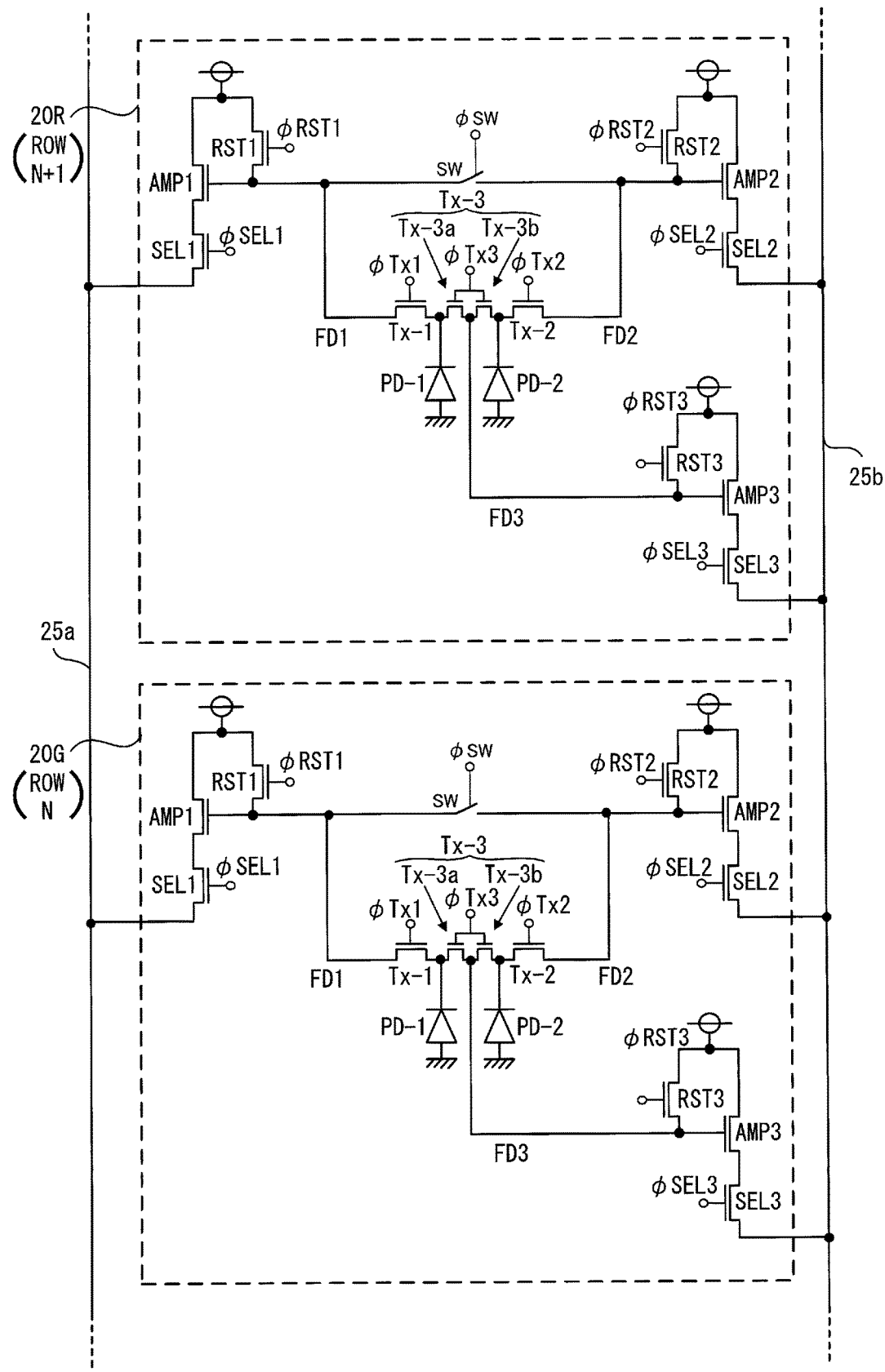
FIG. 10 is a circuit diagram for explanation of pixels arranged in a column M of a second variant of the first embodiment.

In a second variant of the first embodiment, as shown in FIG. 10, a transistor SW is provided that electrically connects together the first FD region FD1 and the second FD region FD2, or alternatively disconnects them from one another. This is in order for it to be possible to perform reading out of a signal based upon the sum of the charge generated by the first photodiode PD-1 and the charge generated by the second photodiode PD-2 by two methods. The first of these methods is a reading out method in which the transistor SW is left OFF and, in a similar manner to the case with the first variant of the first embodiment (refer to FIG. 8), the third selection transistor SEL3 and the third transfer transistor section Tx-3 are turned ON, so that the third signal is read out from the second vertical signal line 25b. And the second of these methods is a reading out method in which the transistor SW is turned ON and the second selection transistor SEL2 and the first and second transfer transistors Tx-1 and Tx-2 are all turned ON, so that the sum of the first signal and the second signal is read out from the second vertical signal line 25b. Of course, as the second method described above, it would also be possible to turn the transistor SW ON and to turn the first selection transistor SEL1 and the first and second transfer transistors Tx-1 and Tx-2 all ON, so that the sum of the first signal and the second signal is read out from the first vertical signal line 25a.

FIG. 10 is a circuit diagram for explanation of pixels 20 arranged in the column M of FIG. 3 (i.e. arranged along the vertical direction) in this second variant of the first embodiment, in other words, for example, for explanation of the pixel 20G of the N-th row and the pixel 20R of the (N+1)-th row. The same reference symbols are appended to elements and structures that are the same as in the first variant of the first embodiment (refer to FIG. 8), and explanation thereof is omitted.

Figure 11:
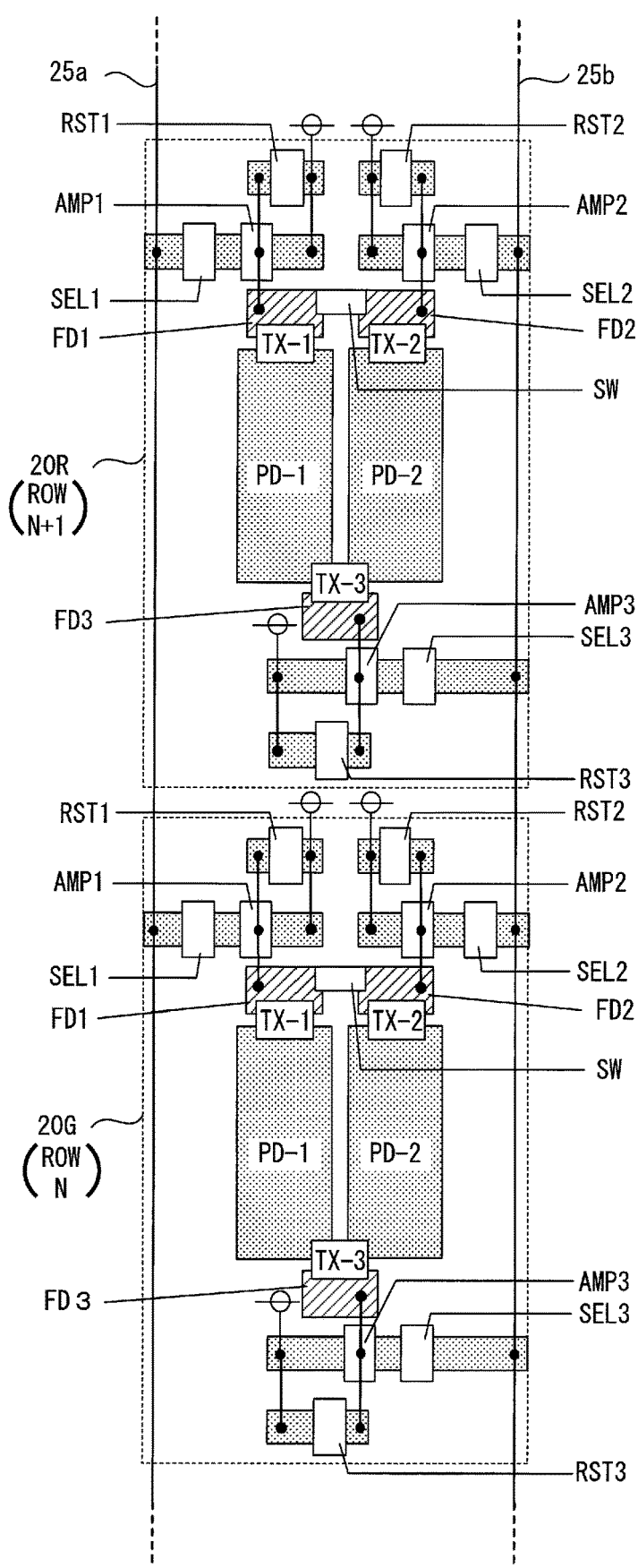
FIG. 11 is a figure for explanation of the layout of the pixels of FIG. 10.

As described above, the difference from the first variant of the first embodiment (refer to FIG. 8) is the provision of the transistor SW, which either connects together the first FD region FD1 and the second FD region FD2 or separates them from one another. FIG. 11 is a schematic figure for explanation of the layout of pixels 20G and 20R corresponding to the circuit diagram of FIG. 10. It should be understood that wiring for providing a control signal φSW for changing over the transistor SW between ON and OFF, the first through third control signals φTx1 through φTx3, the first through third control signals φRST1 through φRST3, and the first through third control signals φSEL1 through φSEL3 is omitted from the figure.

In FIG. 11, in the state in which the transistor SW is ON, the first FD region FD1 and the second FD region FD2 are electrically connected together, so that the total FD region area is doubled. Due to this, the capacitance of the FD region (i.e. of the first FD region FD1+the second FD region FD2) becomes twice or more the capacitance of the first FD region FD1 (or the capacitance of the second FD region FD2, or the capacitance of the third FD region FD3). Due to this, when the transistor SW is ON, the conversion gain of the signal generation unit provided by the FD region (i.e. the first FD region FD1+the second FD region FD2) is decreased by the conversion gain of the third signal generation unit due to the third FD region FD3 (for example to half or less).

By contrast, in the state in which the transistor SW is turned OFF, the first FD region FD1 and the second FD region FD2 are electrically isolated from one another. In this state, similar operations and beneficial effects are obtained to those obtained with the first variant embodiment of the first embodiment (refer to FIG. 8).

According to the above, in this second variant of the first embodiment, changeover between the first reading out method described above and the second reading out method described above is performed according to the situation of photography. For example, when performing photography in dark surroundings or photography of a dark photographic subject, the transistor SW is turned OFF and changeover to the first reading out method described above is performed. Due to this, it is possible to read out a third signal which is based upon a high conversion gain, and which accordingly is at a high level. In this way it is possible to obtain a bright image, even when performing photography in dark surroundings or photography of a dark photographic subject.

On the other hand, when performing photography in over-bright surroundings or photography of a bright photographic subject, the transistor SW is turned ON and changeover to the second reading out method described above is performed. Due to this, it is possible to read out a third signal whose signal level is kept down, since it is based upon a lower conversion gain than in the case of the first reading out method. In this way it is possible to obtain an image of moderate brightness, even when performing photography in over-bright surroundings or photography of a bright photographic subject.

Accordingly, for example, it is possible to detect the brightness of the image that is to be the subject of photography on the basis of the output of the image sensor 3, or on the basis of the output of a sensor for photographic subject luminance detection that is separately provided, and to change over between the first reading out method described above and the second reading out method described above on the basis thereof. In concrete terms, if the output of the image sensor 3 or the output of the sensor for photographic subject luminance detection is less than some threshold value, then the first reading out method described above may be employed; whereas, if the output of the image sensor 3 or the output of the sensor for photographic subject luminance detection is greater than or equal to that threshold value, then the second reading out method described above may be employed.

Explanation of the Time Chart

Figure 12:
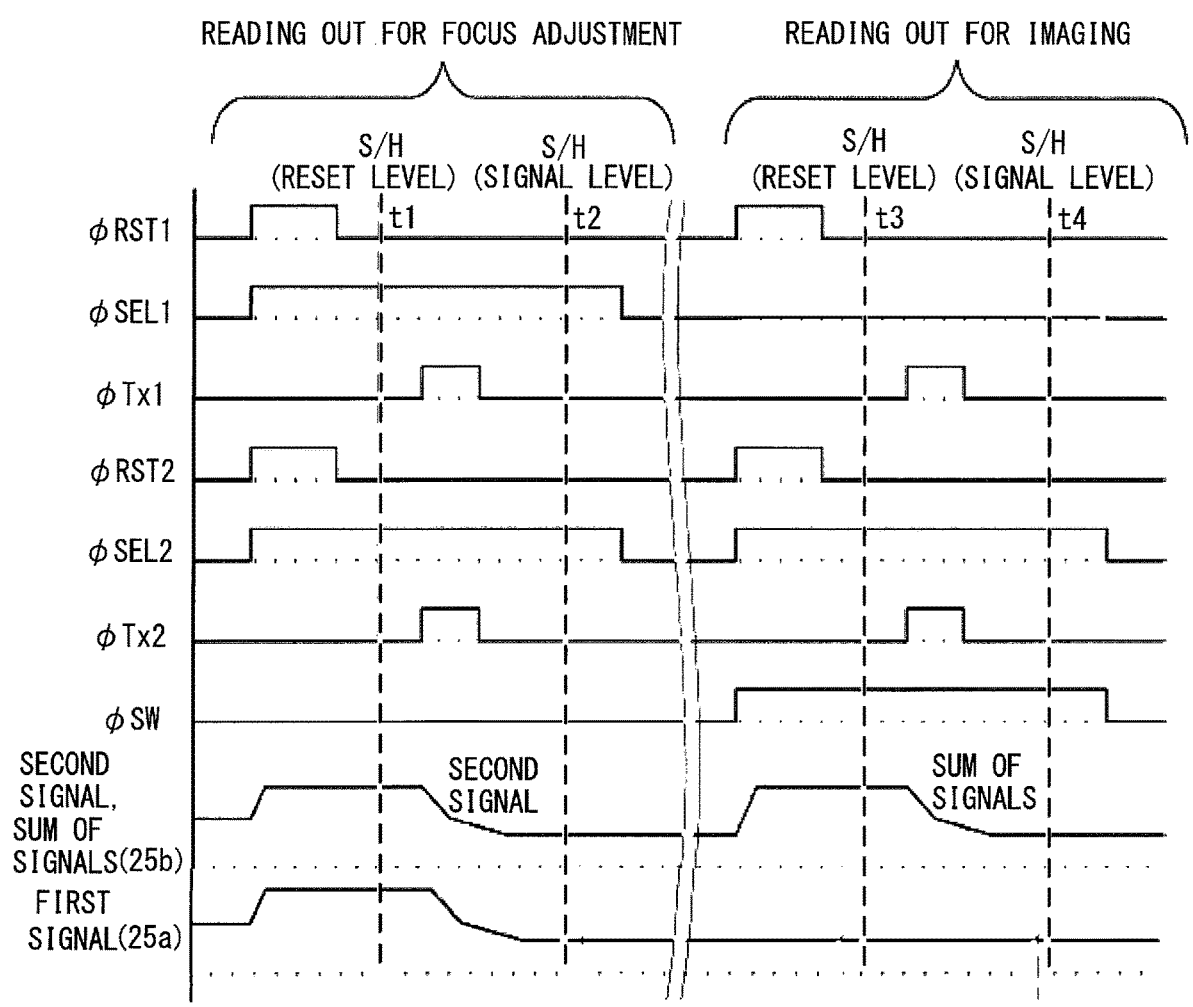
FIG. 12 is a figure for explanation of control signals of various types supplied to this image sensor.

FIG. 12 is a time chart for explanation of the control signals that are supplied to the image sensor 3 during the second reading out method described above. In the interval in which the reading out for focus adjustment is performed, the same procedure as in the case of the first variant of the first embodiment is performed (refer to FIG. 9), and accordingly explanation thereof will be curtailed. And, in the interval in which the reading out for imaging is performed, the transistor SW is turned ON by a control signal φSW at H level being supplied thereto, and thereby the first FD region FD1 and the second FD region FD2 are electrically connected together. Furthermore, by a control signal φSEL2 at H level being supplied, the second selection transistor SEL2 is turned ON, which causes the sum of the first signal and the second signal to be outputted. And, by first and second control signals φRST1 and φRST2 which are both at H level being supplied, the first and second reset transistors RST1 and RST2 are both turned ON, so that the potentials of the first FD region FD1 and the second FD region FD2 are both reset. At the time point shown by the broken line t3, the sum of a first signal and a second signal, both at reset level, is read out via the second vertical signal line 25b.

Next, by transfer pulses both at H level being supplied as the first and second control signals φTx1 and φTx2, the first and second transfer transistors Tx-1 and Tx-2 are turned ON, so that the charge generated by the first photodiode PD-1 and the charge generated by the second photodiode PD-2 are respectively transferred to the first FD region FD-1 and to the second FD region FD-2. Due to this, at the time point shown by the broken line t4, the sum of the signal level of the first signal and the signal level of the second signal is read out via the second vertical signal line 25b.

In this manner, the sum of the first signal and the second signal is read out via the second vertical signal line (output unit) 25b, in the same way as when the second signal is being individually read out.

According to this second variant of the first embodiment explained above, in addition to the operations and beneficial effects of the first embodiment, the following further operations and beneficial effects are obtained.

(1) Since the transistor SW that is capable of electrically connecting together the first FD region FD1 and the second FD region FD2 is provided to this image sensor 3, accordingly it is possible to perform reading out of a signal based upon the sum of the charge generated by the first photodiode PD-1 and the charge generated by the second photodiode PD-2 by two different methods.

(2) Since the camera 1, which is an imaging device, comprises the image sensor 3 of (1) described above, and also the image processing unit 13 that generates image data on the basis of at least one of charges accumulated in the first FD region FD1 and in the second FD region FD2 which are connected together by the transistor SW, and charge accumulated in the third FD region FD3, accordingly, for example, it becomes possible to generate images of different brightness by changing the conversion gain of the signal generation unit by executing one or the other of the two methods described above for reading out the signals.

The Second Embodiment

In a second embodiment of the present invention, signal readout units are shared between pixels 20 that are adjacent in the column direction.

It should be understood that the camera 1 according to this second embodiment also may either be, or may not be, an exchangeable lens type camera, in a similar manner to the case with the first embodiment. Furthermore, it may also be built as an imaging device such as a smart phone or a video camera or the like.

Figure 13:
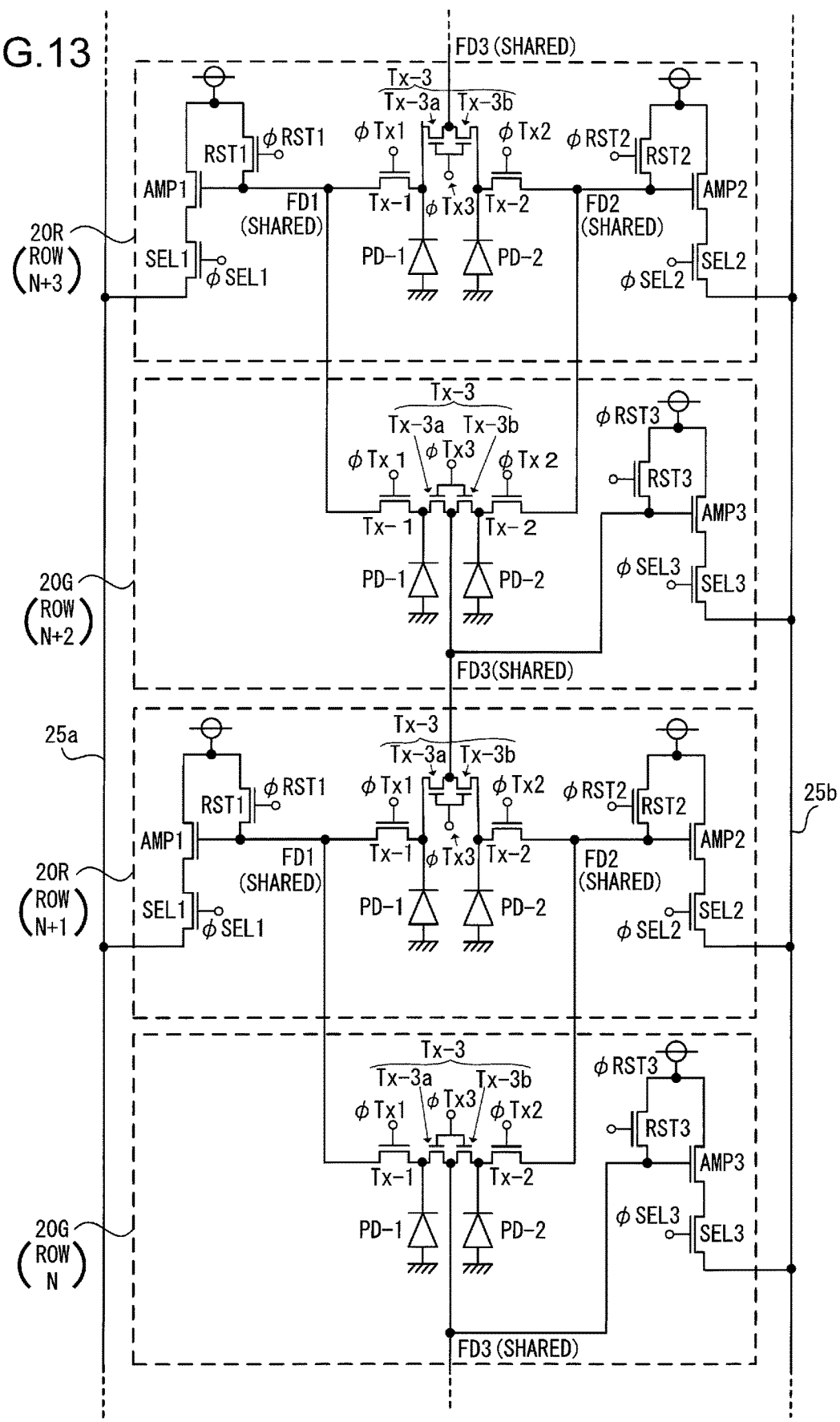
FIG. 13 is a circuit diagram for explanation of pixels arranged in a column M of a second embodiment.

FIG. 13 is a circuit diagram for explanation of pixels 20 arranged in the column M of FIG. 3 (i.e. arranged along the vertical direction) in this second embodiment, in other words, for example, for explanation of the pixel 20G of the N-th row, the pixel 20R of the (N+1)-th row, the pixel 20G of the (N+2)-th row, and the pixel 20R of the (N+3)-th row. To structures that are the same as structures of the first embodiment (refer to FIG. 4), the same reference symbols are appended, and explanation thereof is omitted.

As described above, in this second embodiment, the feature of difference from the first embodiment (refer to FIG. 4) is that the FD regions, the amplification transistors, the reset transistors, and the selection transistors are shared between pixels 20 that are adjacent in the column direction.

In concrete terms, the pixel 20G of the N-th row and the pixel 20R of the (N+1)-th row which are mutually adjacent in the column direction share the first and second FD regions FD1 and FD2, the first and second amplification transistors AMP1 and AMP2, the first and second reset transistors RST1 and RST2, and the first and second selection transistors SEL1 and SEL2, all of which are included in the pixel 20R.

It should be understood that it would also be acceptable for all or some of the first and second FD regions, the first and second amplification transistors, the first and second reset transistors, and the first and second selection transistors that are shared by the pixel 20G of the N-th row and the pixel 20R of the (N+1)-th row which are mutually adjacent in the column direction to be provided between the pixel 20G of the N-th row and the pixel 20R of the (N+1)-th row. Furthermore, some of the above described elements may be provided to the pixel 20G.

Furthermore, the pixel 20R of the (N+1)-th row and the pixel 20G of the (N+2)-th row which are mutually adjacent in the column direction share the third FD region FD3, the third amplification transistor AMP3, the third reset transistor RST3, and the third selection transistor SEL3, all of which are included in the pixel 20G.

It should be understood that it would also be acceptable for all, or some, of the third FD region, the third amplification transistor, the third reset transistor, and the third selection transistor that are shared by the pixel 20R of the (N+1)-th row and the pixel 20G of the (N+2)-th row which are mutually adjacent in the column direction to be provided between the pixel 20G of the (N+1)-th row and the pixel 20G of the (N+2)-th row. Furthermore, some of the above described elements may be provided to the pixel 20R.

In a similar manner, the above described pixel 20G of the N-th row shares the third FD region FD3 (not shown in the figures), the third amplification transistor AMP3 (not shown in the figures), the third reset transistor RST3 (not shown in the figures), and the third selection transistor SEL3 (not shown in the figures) that are included in the pixel 20R of the (N−1)-th row (not shown in the figures) that is on the opposite side to the above described pixel 20R of the (N+1)-th row.

In this manner, for two pixels 20 that are adjacent in the column direction, the first and second FD regions FD1 and FD2, the first and second amplification transistors AMP1 and AMP2, the first and second reset transistors RST1 and RST2, and the first and second selection transistors SEL1 and SEL2 are shared between that two adjacent pixels 20 in the column direction. Furthermore, for two pixels 20 that are adjacent in the column direction, the third FD region FD3, the third amplification transistor AMP3, the third reset transistor RST3, and the third selection transistor SEL3 are shared between the above described two pixels 20 that are adjacent in the column direction.

Figure 14:
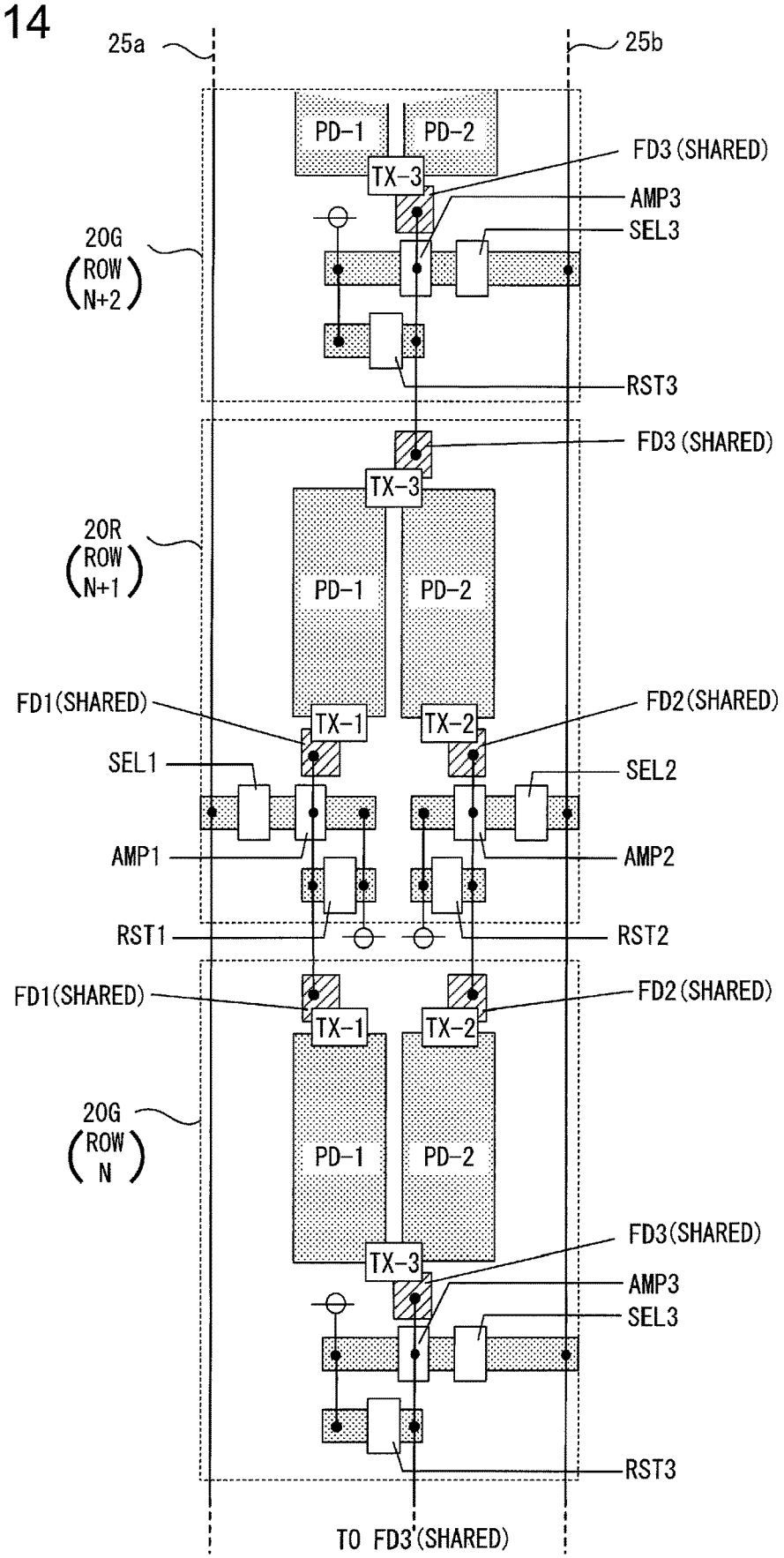
FIG. 14 is a figure for explanation of the layout of the pixels of FIG. 13.

FIG. 14 is a schematic view for explanation of the layout of the pixels 20G and 20R that correspond to the circuit diagram of FIG. 13. It should be understood that the wiring for the first through third control signals φTx1 through φTx3, the first through third control signals φRST1 through φRST3, and the first through third control signals φSEL1 through φSEL3 is not shown in the figure.

Since, according to the example of FIG. 14, the first through third amplification transistors AMP1 through AMP3, the first through third reset transistors RST1 through RST3, and the first through third selection transistors SEL1 through SEL3 are shared between pixels 20 that are adjacent in the column direction, accordingly it is possible to reduce the space occupied by every two pixels by the amount of nine transistors, as compared with the first embodiment (refer to FIG. 5) in which no such sharing is implemented. In other words, while in the example of FIG. 5 there are twelve transistors for each pixel (so that there are a total of twenty-four transistors for two pixels), since in the example of FIG. 14 there are six transistors for the pixel 20G and nine transistors for the pixel 20R (so that there are a total of fifteen transistors for the two pixels), accordingly it is possible to improve the efficiency of implementation.

Furthermore, in any one of the pixels 20, the area of the gate oxide of the first transfer transistor Tx-1 and the area of the first FD region FD1, which are strongly related to the capacitance of the first FD region FD1, are approximately the same as the area of the gate oxide of the second transfer transistor Tx-2 and the area of the second FD region FD1, which are strongly related to the capacitance of the second FD region FD2.

Yet further, in any one of the pixels 20, the area of the gate oxide of the third transfer transistor Tx-3 and the area of the third FD region FD3, which are strongly related to the capacitance of the third FD region FD3, are also approximately the same as the area of the gate oxide of the first transfer transistor Tx-1 and the area of the first FD region FD1 described above, or the area of the gate oxide of the second transfer transistor Tx-2 and the area of the second FD region FD2.

Accordingly, since the three pairs of a transfer transistor and an FD region described above are all formed by the same process, therefore the capacitances of the three FD regions FD1 through FD3 are approximately equal.

Since, in each pixel 20, it is arranged for the areas of the first and second photodiodes PD-1 and PD-2 to be approximately the same, accordingly the amounts of charge that they generate per unit amount of incident light (i.e. their photoelectric conversion efficiencies) are also approximately equal. For example, if the same amounts of light are incident upon the first and second photodiodes PD-1 and PD-2, then the amounts Q of charge generated by the first and second photodiodes PD-1 and PD-2 are also approximately equal. Accordingly, the amounts of charge Q respectively transferred from the first and second photodiodes PD-1 and PD-2 to the first FD region FD1 and to the second FD region FD2 are approximately equal. As described above, by making the capacitances C of the first FD region FD1 and the second FD region FD2 be approximately the same, the magnitudes of the signals generated by the first signal generation unit and the second signal generation unit also become approximately equal. Accordingly, the conversion gains of the first signal generation unit and the second signal generation unit during photoelectric conversion become approximately equal.

Even further, since the capacitance C of the third FD region FD3 in the third signal generation unit is approximately the same as the capacitance C of the first FD region FD1 in the first signal generation unit (and as the capacitance C of the second FD region FD2 in the second signal generation unit), accordingly, in the cases of the third signal generation unit and the first signal generation unit (and the second signal generation unit), the conversion gains during photoelectric conversion also become approximately equal. Accordingly, as described above, if the same amounts of light are incident upon the first and second photodiodes PD-1 and PD-2, then the magnitude of the signal generated by the third signal generation unit is approximately twice the magnitude of the signal generated by the first signal generation unit (and twice the magnitude of the signal generated by the second signal generation unit).

As explained above, it is possible to prevent deterioration of the conversion gain when the signals based upon the charges generated by the first photodiode PD-1 and the second photodiode PD-2 are read out all together, as compared to the case when the signals based upon the charges generated by the first photodiode PD-1 or the second photodiode PD-2 are read out individually.

In this second embodiment, the various control signals that are supplied to the image sensor 3 may have timings similar to those shown in the time chart shown by way of example in FIG. 9.

According to the second embodiment explained above, in addition to the operations and beneficial effects of the first embodiment, the following further operations and beneficial effects are obtained.

In the pixel 20R of this image sensor 3 (of the (N+1)-th row: refer to FIG. 14), for example, it is arranged for the first FD region FD1 and the second FD region FD2 to be shared with one of the adjacent pixels 20G in the column direction (the one in the N-th row), while the third FD region FD3 is shared with the other pixel 20G in the column direction (the one in the (N+2)-th row). Due to this, it is possible to reduce the space occupied by every two pixels by the amount of nine transistors, as compared to the case in the first embodiment (refer to FIG. 5) in which no such sharing is implemented. In other words, while in the example of FIG. 5 there are twelve transistors for each pixel (so that there are a total of twenty-four transistors for two pixels), since in the example of FIG. 14 there are six transistors for the pixel 20G and nine transistors for the pixel 20R (so that there are a total of fifteen transistors for the two pixels), accordingly it is possible to improve the efficiency of implementation.

The following variants also come within the scope of the present invention; and it would also be possible to combine one or more of the following variant embodiments with the embodiment described above.

The First Variant of the Second Embodiment

In a first variant of the second embodiment, the first through third FD regions FD1 through FD3, the first through third amplification transistors AMP1 through AMP3, the first through third reset transistors RST1 through RST3, and the first through third selection transistors SEL1 through SEL3 are shared between a pair of two pixels that are adjacent in the column direction.

While schematic figures for explanation of the circuit diagram and the layout are omitted, in a similar manner to the case with the second embodiment, it is possible to reduce the space occupied by two pixels by the amount of nine transistors, as compared to the case of the first embodiment (refer to FIG. 5) in which no such sharing is implemented. In other words, while in the first embodiment there are a total of twenty-four transistors for two pixels, since in this first variant of the second embodiment, in a similar manner to the case for the second embodiment, there are a total of fifteen transistors for two pixels that are adjacent in the column direction, accordingly it is possible to improve the efficiency of implementation.

The Second Variant of the Second Embodiment

Figure 15:
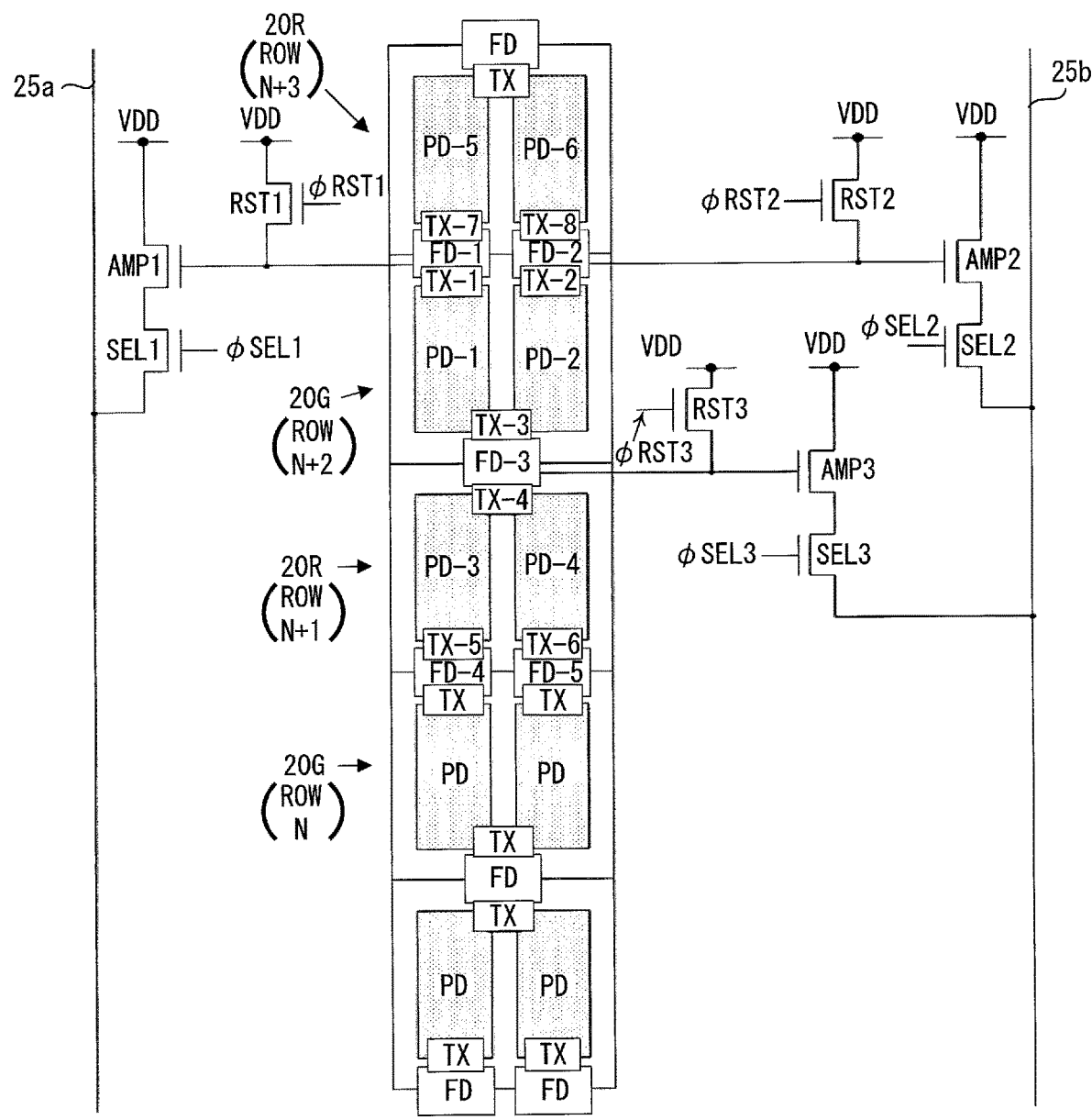
FIG. 15 is a figure that, among pixels of a column M in a second variant of the second embodiment, focuses upon a pixel of the (N+1)-th row, a pixel 20G of the (N+2)-th row, and a pixel 20R of the (N+3)-th row.

The supply, in a second variant of the second embodiment, of control signals to the image sensor 3 having the circuit diagram shown by way of example in FIG. 13 at a timing different from that of FIG. 9 and the operation of reading out therefrom will now be explained. FIG. 15 is a figure that, among pixels of the column M of FIG. 3 (i.e. arranged in the vertical direction) in this second variant of the second embodiment, focuses upon a pixel 20R of the (N+1)-th row, a pixel 20G of the (N+2)-th row, and a pixel 20R of the (N+3)-th row. In FIG. 15, the circuitry for the readout unit that is shared between the pixel 20G of the (N+2)-th row and the pixel 20R of the (N+3)-th row and the circuitry for the readout unit that is shared between the pixel 20R of the (N+2)-th row and the pixel 20G of the (N+2)-th row are described, while description of the circuitry for the other readout units is omitted.

Furthermore, in order to explain the timing of control signals that will be explained hereinafter in a manner that is easy to understand, the reference symbols FD1 and FD2 will be appended to the two FD regions that are shared in common between the pixel 20R of the (N+3)-th row and the pixel 20G of the (N+2)-th row, respectively. And the reference symbols PD-5 and PD-6 will be appended to the first and second photodiodes that are included in the pixel 20R of the (N+3)-th row, respectively. Moreover, the reference symbols Tx-7 and Tx-8 will respectively be appended to the first and second transfer transistors that transfer the charge generated by the first photodiode PD-5 and the charge generated by the second photodiode PD-6 respectively to the FD region FD1 and to the FD region FD2.

Next, the reference symbol FD3 will be appended to the FD region that is shared in common between the pixel 20G of the (N+2)-th row and the pixel 20R of the (N+1)-th row. And the reference symbols PD-1 and PD-2 will respectively be appended to the first and second photodiodes that are included in the pixel 20G of the (N+2)-th row. Moreover, the reference symbols Tx-1 and Tx-2 will respectively be appended to the first and second transfer transistors that transfer the charge generated by the first photodiode PD-1 and the charge generated by the second photodiode PD-2 respectively to the FD region FD1 and to the FD region FD2. Even further, the reference symbol Tx-3 will be appended to the third transfer transistor section that transfers the charge generated by the first photodiode PD-1 and the charge generated by the second photodiode PD-2 to the FD region FD3.

Next, the reference symbols FD4 and FD5 will be appended to the two FD regions that are shared in common between the pixel 20R of the (N+1)-th row and the N-th row pixel 20G, respectively. And the reference symbols PD-3 and PD-4 will be appended to the first and second photodiodes that are included in the pixel 20R of the (N+1)-th row, respectively. Moreover, the reference symbol Tx-4 will be appended to the third transfer transistor section that transfers the charges generated by the first and second photodiodes PD-3 and PD-4 to the FD region FD3.

Even further, the reference symbols Tx-5 and Tx-6 will be respectively appended to the first and second transfer transistors that transfer the charge generated by the first photodiode PD-3 and the charge generated by the second photodiode PD-4 to the FD region FD4 and to the FD region FD5 respectively.

Explanation of the Time Chart

Figure 16:
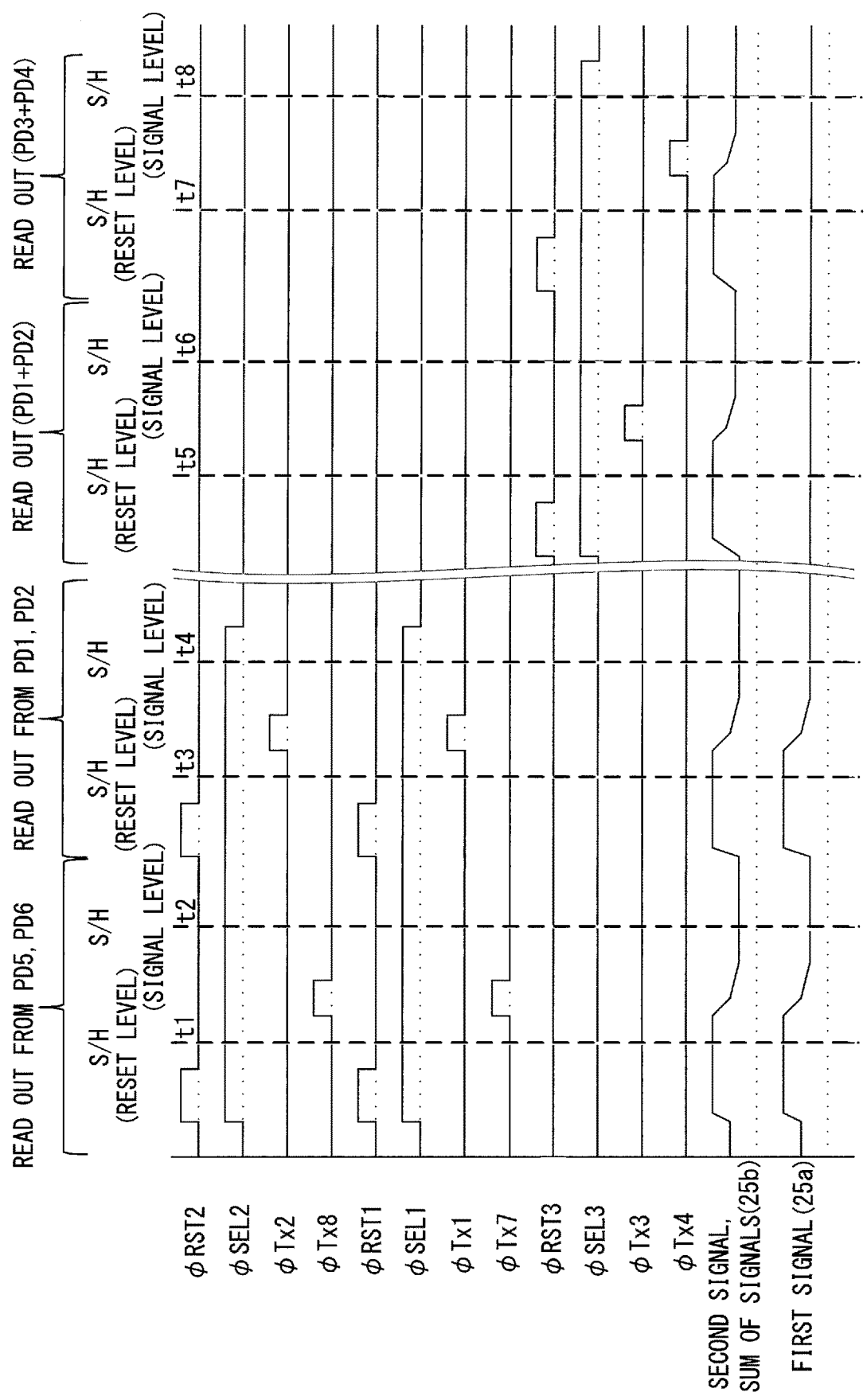
FIG. 16 is a figure for explanation of control signals of various types supplied to this image sensor of the second variant of the second embodiment.

FIG. 16 is a time chart for explanation of control signals of various types that are supplied to this image sensor 3 according to the second variant of the second embodiment. The operation of reading out from the first and second photodiodes PD-5 and PD-6 that are included in the pixel 20R for the (N+3)-th row during the interval while the reading out for focus adjustment is performed will now be explained.

By the first and second control signals φSEL1 and φSEL2 both being supplied at H level, the first selection transistor SEL1 that causes the first signal to be outputted and the second selection transistor SEL2 that causes the second signal to be outputted are both turned ON. Moreover, due to a reset pulse at H level being supplied as the first control signal φRST1 the first reset transistor RST1 is turned ON and the potential of the first FD region FD1 is reset. In a similar manner, due to a reset pulse at H level being supplied as the second control signal φRST2, the second reset transistor RST2 is turned ON and the potential of the second FD region FD2 is reset. At the time point indicated by the broken line t1, the first signal and the second signal, both at reset level, are read out via the first and second vertical signal lines 25a and 25b respectively.

Next, by a transfer pulse at H level being supplied as the control signal φTx7, the first transfer transistor Tx-7 is turned ON and the charge generated by the first photodiode PD-5 is transferred to the first FD region FD1. In a similar manner, by a transfer pulse at H level being supplied as the control signal φTx8, the second transfer transistor Tx-8 is turned ON and the charge generated by the second photodiode PD-6 is transferred to the second FD region FD2. Due to this, at the time point indicated by the broken line t2, the first signal and the second signal both at signal level are read out via the first and second vertical signal lines 25a and 25b respectively.

Next, the operation for reading out from the first and second photodiodes PD-1 and PD-2 that are included in the pixel 20G of the (N+2)-th row will be explained.

By the first and second control signals φSEL1 and φSEL2 at H level being supplied, the first selection transistor SEL1 that causes the first signal to be outputted and the second selection transistor SEL2 that causes the second signal to be outputted are both turned ON. Moreover, by a reset pulse at H level being supplied as the first control signal φRST1 the first reset transistor RST1 is turned ON and the potential of the FD region FD1 is reset. In a similar manner, by a reset pulse at H level being supplied as the second control signal φRST2, the second reset transistor RST2 is turned ON and the potential of the FD region FD2 is reset. At the time point shown by the broken line t3, a first signal and a second signal, both at reset level, are read out via the first and second vertical signal lines 25a and 25b respectively.

Next, by a transfer pulse at H level being supplied as the control signal φTx1, the first transfer transistor Tx-1 is turned ON and the charge generated by the first photodiode PD-1 is transferred to the FD region FD1. In a similar manner, by a transfer pulse at H level being supplied as the control signal φTx2, the second transfer transistor Tx-2 is turned ON and the charge generated by the second photodiode PD-2 is transferred to the FD region FD2. Due to this, at the time point shown by the broken line t4, a first signal and a second signal, both having corresponding signal levels, are read out via the first and second vertical signal lines 25a and 25b respectively.

The operation for reading out from the first and second photodiodes PD-1 and PD-2 that are included in the pixel 20G of the (N+2)-th row during the interval in which reading out for imaging is performed will now be explained.

By a third control signal φSEL3 at H level being supplied, the third selection transistor SEL3 that causes the third signal to be outputted is turned ON. Moreover, by a reset pulse at H level being supplied as the third control signal φRST3, the third reset transistor RST3 is turned ON and the potential of the FD region FD3 is reset. And, at the time point shown by the broken line t5, a third signal that is at reset level is read out via the second vertical signal line 25b.

Next, by a transfer pulse at H level being supplied as the control signal φTx3, the third transfer transistor section Tx-3 is turned ON and the charge that has been generated by the first photodiode PD-1 and the charge that has been generated by the second photodiode PD-2 are both transferred to the FD region FD3. Due to this, at the time point shown by the broken line t6, a third signal having a corresponding signal level is read out via the second vertical signal line 25b.

In this manner, it is possible to read out the third signal due to the first and second photodiodes PD-1 and PD-2 via the second vertical signal line (output unit) 25b, which is the same signal line as that for the second signal.

Next, the operation for reading out from the first and second photodiodes PD-3 and PD-4 that are included in the pixel 20R of the (N+1)-th row will be explained.

By a control signal φSEL3 at H level being supplied, the third selection transistor SEL3 that causes the third signal to be outputted is turned ON. Moreover, by a reset pulse at H level being supplied as the third control signal φRST3, the third reset transistor RST3 is turned ON and the potential of the FD region FD3 is reset. And, at the time point shown by the broken line t7, a third signal that is at reset level is read out via the second vertical signal line 25b.

Next, by a transfer pulse at H level being supplied as the control signal φTx4, the third transfer transistor section Tx-4 is turned ON and the charge that has been generated by the first photodiode PD-3 and the charge that has been generated by the second photodiode PD-4 are both transferred to the FD region FD3. Due to this, at the time point shown by the broken line t8, a third signal having a corresponding signal level is read out via the second vertical signal line 25b.

In this manner, it is possible to read out the third signal due to the first and second photodiodes PD-3 and PD-4 via the second vertical signal line (output unit) 25b, which is the same signal line as that for the second signal.

According to this second variant of the second embodiment, when reading out for focus adjustment is being performed, it is possible to perform the reading out one row at a time. Furthermore, also when the reading out for imaging is being performed, it is possible to perform the reading out one row at a time. Due to this, it is possible to perform reading out of the signals while changing over, for each row, between reading out for focus adjustment and reading out for imaging, as desired.

The Third Embodiment

A structure, in a third embodiment of the present invention, in which each pixel has four photodiodes will now be explained. This four photodiode per pixel configuration is a structure in which each of the pixels 20 comprises four photodiodes PD-1, PD-2, PD-3, and PD-4, each being a photoelectric conversion unit, behind a micro lens ML and a color filter. In other words, for example, each of the pixels 20 comprises a first photodiode PD-1 disposed at the upper right of the pixel position, a second photodiode PD-2 disposed at the upper left of the pixel position, a third photodiode PD-3 disposed at the lower right of the pixel position, and a fourth photodiode PD-4 disposed at the lower left of the pixel position.

Due to this, ray bundles that have passed through a first region of the pupil of the photographic lens 2 are incident upon the first photodiodes PD-1 of the pixels 20; ray bundles that have passed through a second region of the pupil of the photographic lens 2 are incident upon the second photodiodes PD-2 of the pixels 20; ray bundles that have passed through a third region of the pupil of the photographic lens 2 are incident upon the third photodiodes PD-3 of the pixels 20; and ray bundles that have passed through a fourth region of the pupil of the photographic lens 2 are incident upon the fourth photodiodes PD-4 of the pixels 20.

In general when, as in the first and second embodiments, the regions of the pupil of the photographic lens are divided in the horizontal direction (i.e. in the row direction), this is appropriate when focus detection is to be performed upon a pattern of the photographic subject in the vertical direction. On the other hand, when the regions of the pupil of the photographic lens are divided in the vertical direction (i.e. in the column direction), this is appropriate when focus detection is to be performed upon a pattern of the photographic subject in the horizontal direction. With this third embodiment, by constructing each pixel to have four photodiodes, it is possible to perform focus detection irrespective of the direction of the pattern of the photographic subject. In the following, this image sensor 3 having four photodiodes per each single pixel will be explained in detail.

Figure 17:
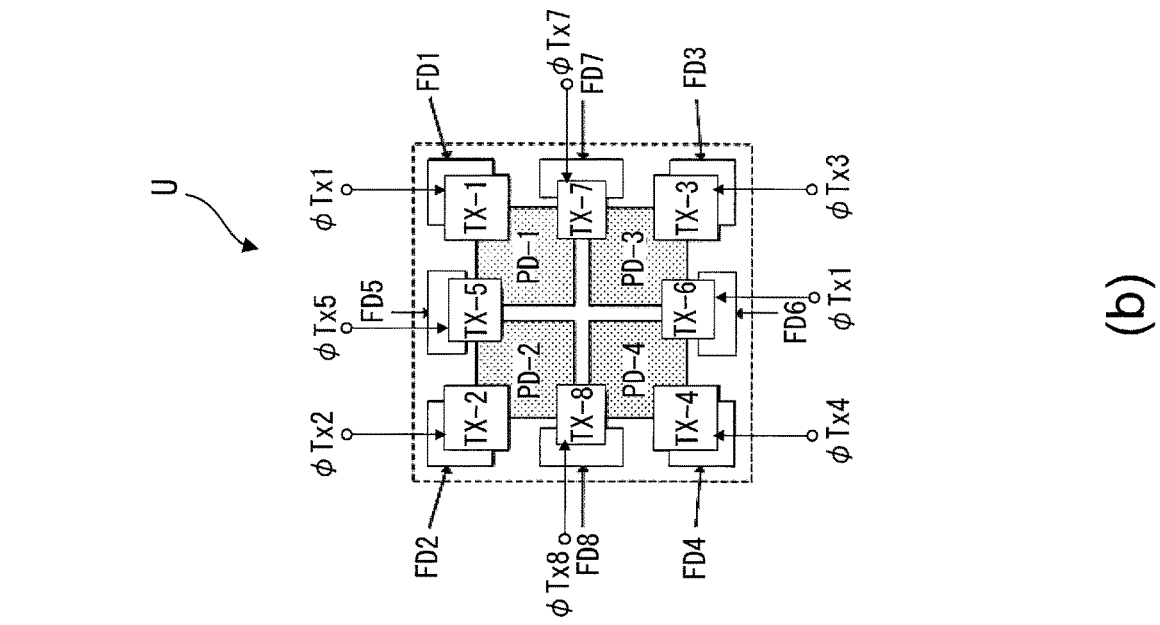
FIG. 17(*a*) is a figure for explanation of circuitry of pixels of an image sensor of a third embodiment, and FIG. 17(*b*) is a figure showing an enlarged view of a region U of a photoelectric conversion unit in FIG. 17(*a*)
Figure 17:
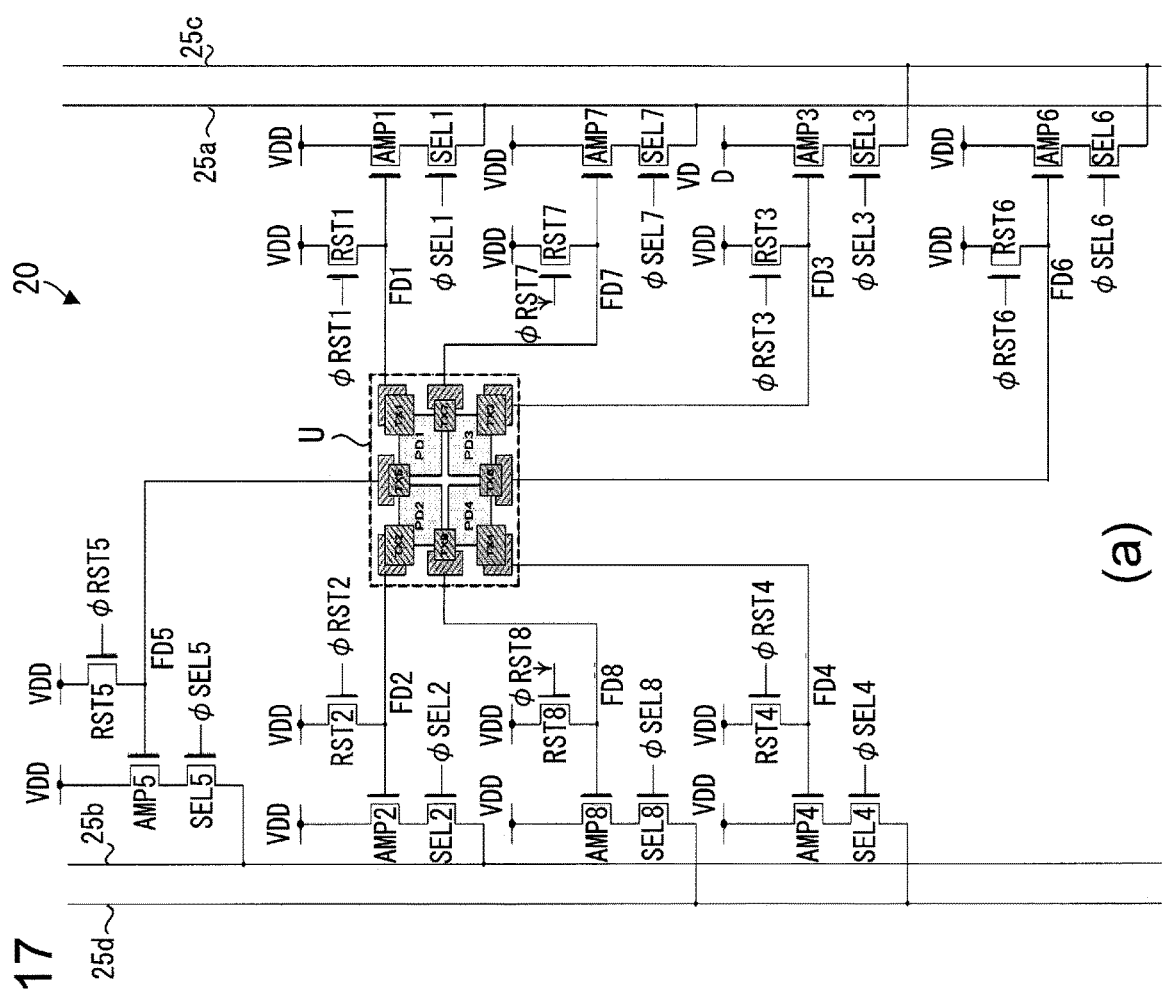

FIG. 17(a) is a figure for explanation of circuitry of a pixel 20 of an image sensor 3 according to this third embodiment. Moreover, FIG. 17(b) is a figure showing an enlarged view of a region U of a photoelectric conversion unit of FIG. 17(a). The first photodiode PD-1 disposed at the upper right of the pixel position, the second photodiode PD-2 disposed at the upper left of the pixel position, the third photodiode PD-3 disposed at the lower right of the pixel position, the fourth photodiode PD-4 disposed at the lower left of the pixel position are located in this region U.

The Control Signals

In the region U, when a charge that has been generated by the first photodiode PD-1 is to be transferred to an FD region FD1, a first transfer transistor Tx-1 is turned ON by a first control signal φTx1. And, when a charge that has been generated by the second photodiode PD-2 is to be transferred to an FD region FD2, a second transfer transistor Tx-2 is turned ON by a second control signal φTx2. Moreover, when a charge that has been generated by the first photodiode PD-1 and a charge that has been generated by the second photodiode PD-2 are to be transferred together to an FD region FD5, a fifth transfer transistor section Tx-5 is turned ON by a fifth control signal φTx5. In other words, transfer transistors Tx-5a and Tx-5b (not shown in the figures) of the fifth transfer transistor section Tx-5 are both turned ON simultaneously by the fifth control signal φTx5.

Furthermore, in the region U, when a charge that has been generated by the third photodiode PD-3 is to be transferred to an FD region FD3, a third transfer transistor Tx-3 is turned ON by a third control signal φTx3. And, when a charge that has been generated by the fourth photodiode PD-4 is to be transferred to an FD region FD4, a fourth transfer transistor Tx-2 is turned ON by a fourth control signal φTx4. Moreover, when a charge that has been generated by the third photodiode PD-3 and a charge that has been generated by the fourth photodiode PD-4 are to be transferred together to an FD region FD6, a sixth transfer transistor section Tx-6 is turned ON by a sixth control signal φTx6. In other words, transfer transistors Tx-6a and Tx-6b (not shown in the figures) of the sixth transfer transistor section Tx-6 are both turned ON simultaneously by the sixth control signal φTx6.

Yet further, in the region U, when a charge that has been generated by the first photodiode PD-1 and a charge that has been generated by the third photodiode PD-3 are to be transferred together to an FD region FD7, a seventh transfer transistor section Tx-7 is turned ON by a seventh control signal φTx7. In other words, transfer transistors Tx-7a and Tx-7b (not shown in the figures) of the seventh transfer transistor section Tx-7 are both turned ON simultaneously by the seventh control signal φTx7.

Even further, in the region U, when a charge that has been generated by the second photodiode PD-2 and a charge that has been generated by the fourth photodiode PD-4 are to be transferred together to an FD region FD8, an eighth transfer transistor section Tx-8 is turned ON by an eighth control signal φTx8. In other words, transfer transistors Tx-8a and Tx-8b (not shown in the figures) of the eighth transfer transistor section Tx-8 are both turned ON simultaneously by the eighth control signal φTx8.

In this third embodiment, for each single pixel column of the image sensor 3, four vertical signal lines are provided, these being first through fourth signal lines 25a, 25b, 25c, and 25d. A signal based upon the charge generated by the first photodiode PD-1 and a signal based upon the sum of the charge generated by the first photodiode PD-1 and the charge generated by the third photodiode PD-3 are read out via the first vertical signal line 25a.

Moreover, a signal based upon the charge generated by the second photodiode PD-2 and a signal based upon the sum of the charge generated by the first photodiode PD-1 and the charge generated by the second photodiode PD-2 are read out via the second vertical signal line 25b.

Furthermore, a signal based upon the charge generated by the third photodiode PD-3 and a signal based upon the sum of the charge generated by the third photodiode PD-3 and the charge generated by the fourth photodiode PD-4 are read out via the third vertical signal line 25c.

Yet further, a signal based upon the charge generated by the fourth photodiode PD-4 and a signal based upon the sum of the charge generated by the second photodiode PD-2 and the charge generated by the fourth photodiode PD-4 are read out via the fourth vertical signal line 25d.

When the region of the pupil of the photographic lens 2 is divided in the horizontal direction (i.e. in the row direction) with the pixel 20 described above, then, for example, a signal based upon the sum of the charge generated by the first photodiode PD-1 and the charge generated by the third photodiode PD-3, and a signal based upon the sum of the charge generated by the second photodiode PD-2 and the charge generated by the fourth photodiode PD-4, are read out. In other words, signals added together by the FD region 7 and by the FD region 8 respectively are read out.

On the other hand, when the region of the pupil of the photographic lens 2 is divided in the vertical direction (i.e. in the column direction) with the pixel 20 described above, then, for example, a signal based upon the sum of the charge generated by the first photodiode PD-1 and the charge generated by the second photodiode PD-2, and a signal based upon the sum of the charge generated by the third photodiode PD-3 and the charge generated by the fourth photodiode PD-4, are read out. In other words, signals added together by the FD region 5 and by the FD region 6 respectively are read out.

Explanation of the Time Chart

Figure 18:
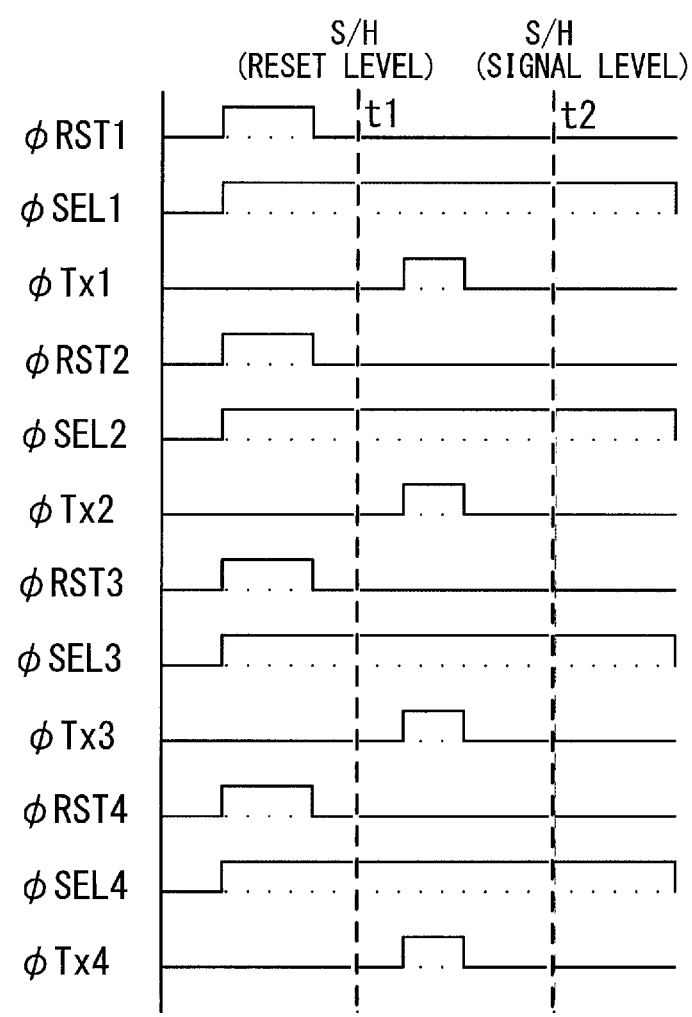
FIG. 18 is a figure for explanation of control signals of various types supplied to this image sensor of the third embodiment.

FIG. 18 is a time chart for explanation of control signals of various types that are supplied to this image sensor 3 according to this third embodiment. Referring to FIG. 18, the reading out operation when individually reading out signals based upon the charges generated by the first through the fourth photodiodes PD-1 through PD-4 of the pixel 20 shown in FIG. 17(a) and FIG. 17(b) will now be explained. In this third embodiment, as described above, four vertical signal lines (i.e. the first through fourth vertical signal lines 25a, 25b, 25c, and 25d) are provided for a single pixel column of the image sensor 3. Due to this, it is possible for the signals based upon the charges generated by the first through the fourth photodiodes PD-1 through PD-4 to be read out at the same timing, as will be explained below.

It should be understood that, in FIG. 18, the signal waveforms of the first through fourth vertical signal lines 25a, 25b, 25c, and 25d are omitted.

By first through fourth control signals φSEL1 through φSEL4 at H level being supplied from the vertical scan circuit 21, the first selection transistor SEL1 that causes a signal to be outputted on the basis of the charge generated by the first photodiode PD-1, the second selection transistor SEL2 that causes a signal to be outputted on the basis of the charge generated by the second photodiode PD-2, the third selection transistor SEL3 that causes a signal to be outputted on the basis of the charge generated by the third photodiode PD-3, and the fourth selection transistor SEL4 that causes a signal to be outputted on the basis of the charge generated by the fourth photodiode PD-4 are all turned ON.

Moreover, due to a reset pulse at H level being supplied as the first control signal φRST1, the first reset transistor RST1 is turned ON and the potential of the first FD region FD1 is reset. In a similar manner, due to reset pulses at H level being supplied as the second through fourth control signals φRST2 through φRST4, the second through fourth reset transistors RST2 through RST4 are respectively turned ON and the potentials of the second FD region FD2 through the fourth FD region FD4 are respectively reset. Due to this, at the time point indicated by the broken line t1, signals at reset level are read out via the first through the fourth vertical signal lines 25a through 25d, respectively.

Next, by transfer pulses at H level being supplied as the control signals φTx1 through φTx4 to the first through fourth transfer transistors Tx-1 through Tx-4 respectively, the first through fourth transfer transistors Tx-1 through Tx-4 are respectively turned ON. Due to this, the charges generated by the first through the fourth photodiodes PD-1 through PD-4 are respectively transferred to the FD regions FD1 through FD4. Accordingly, at the time point indicated by the broken line t2, signals having corresponding signal levels are read out via the first through the fourth vertical signal lines 25a through 25d respectively.

Next, the operations will be explained of reading out when performing reading out for focus adjustment in order to detect the phase difference in the vertical direction, and when performing reading out for focus adjustment in order to detect the phase difference in the horizontal direction.

Figure 19:
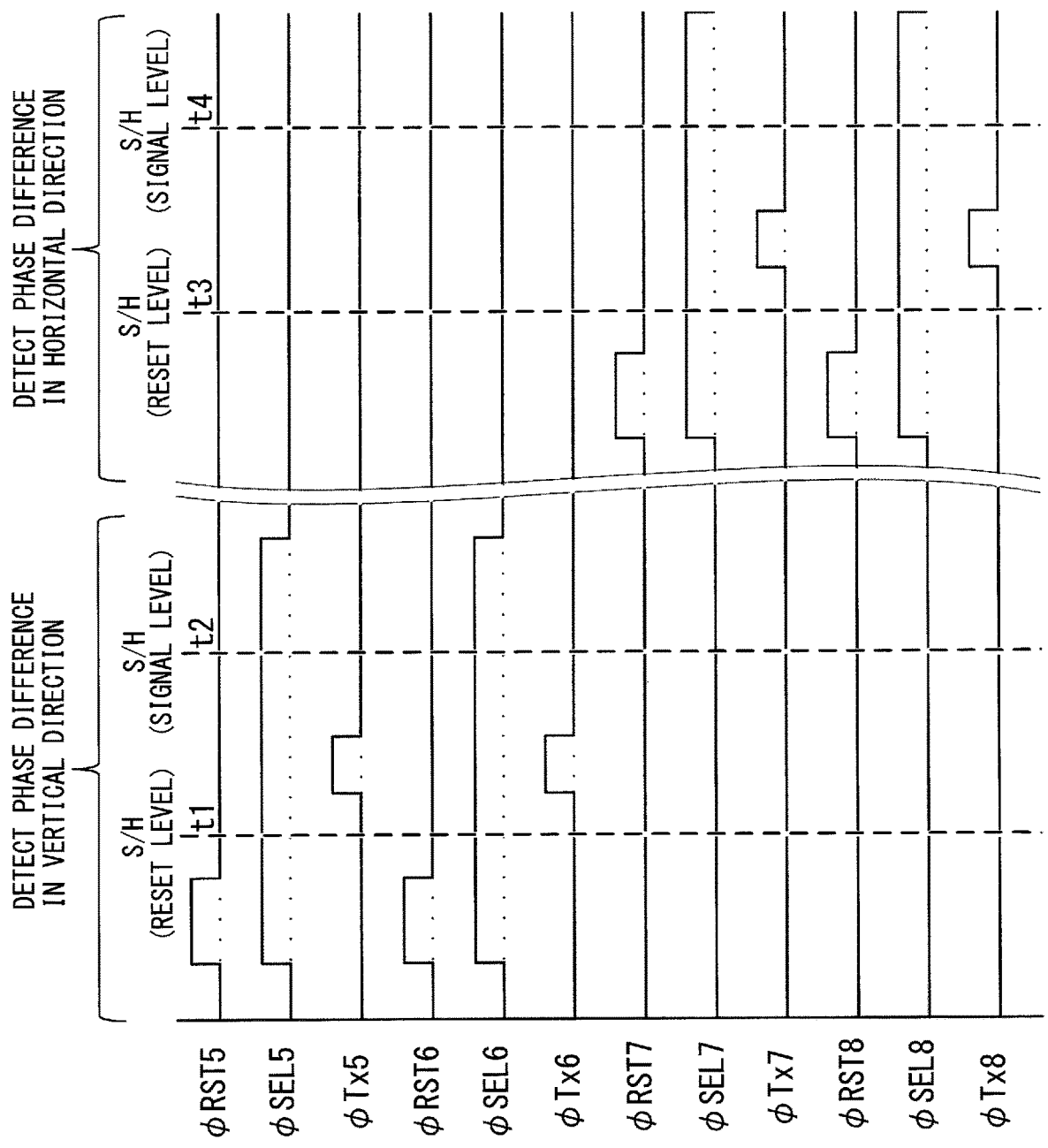
FIG. 19 is a figure for explanation of control signals of various types that are supplied when reading out from the image sensor of the third embodiment for focus adjustment.

FIG. 19 is a time chart for explanation of control signals of various types that are supplied to this image sensor 3 of the third embodiment during reading out for focus adjustment.

It should be understood that, in FIG. 19, the signal waveforms of the first through the fourth vertical signal lines 25a, 25b, 25c, and 25d are omitted.

Division in the Vertical Direction

As described above, when the division is in the vertical direction, signals added together in the FD region 5 and in the FD region 6 are read out. By fifth and sixth control signals φSEL5 and φSEL6 at H level being supplied from the vertical scan circuit 21, the fifth selection transistor SEL5 that causes a signal based upon the sum of the charges generated by the first and second photodiodes PD-1 and PD-2 to be outputted, and the sixth selection transistor SEL6 that causes a signal based upon the sum of the charges generated by the first and second photodiodes PD-3 and PD-4 to be outputted, are respectively turned ON.

Furthermore, by a reset pulse at H level being supplied as the fifth control signal φRST5, the fifth reset transistor RST5 is turned ON and the potential of the FD region FD5 is reset. In a similar manner, by a reset pulse at H level being supplied as the sixth control signal φRST6, the sixth reset transistor RST6 is turned ON and the potential of the FD region FD6 is reset. Accordingly, at the time point indicated by the broken line t1, signals both at reset level are read out via the first and the third vertical signal lines 25b and 25c respectively.

Next, by a transfer pulse at H level being supplied as the fifth control signal φTx5, the fifth transfer transistor section Tx-5 is turned ON. Due to this, the charges that have been generated by the first and second photodiodes PD-1 and PD-2 are both transferred to the FD region FD5. And, by a transfer pulse at H level being supplied as the control signal φTx6 simultaneously with the supply of the control signal φTx5, the sixth transfer transistor section Tx-6 is turned ON. Due to this, the charges that have been generated by the third and fourth photodiodes PD-3 and PD-4 are both transferred to the FD region FD6. As a consequence, at the time point shown by the broken line t2, signals based upon the sums of the signal levels (i.e. a signal based upon the sum of the charges respectively generated by the first and second photodiodes PD-1 and PD-2, and a signal based upon the sum of the charges respectively generated by the third and fourth photodiodes PD-3 and PD-4) are respectively read out via the second and third vertical signal lines 25b and 25c.

Division in the Horizontal Direction

As described above, when the division is in the horizontal direction, signals added together in the FD region 7 and in the FD region 8 are read out. By seventh and eighth control signals φSEL7 and φSEL8 at H level being supplied from the vertical scan circuit 21, the seventh selection transistor SEL7 that causes a signal based upon the sum of the charges generated by the first and third photodiodes PD-1 and PD-3 to be outputted, and the eighth selection transistor SEL6 that causes a signal based upon the sum of the charges generated by the second and fourth photodiodes PD-2 and PD-4 to be outputted, are respectively turned ON.

Furthermore, by a reset pulse at H level being supplied as the seventh control signal φRST7, the seventh reset transistor RST7 is turned ON and the potential of the FD region FD7 is reset. In a similar manner, by a reset pulse at H level being supplied as the eighth control signal φRST8, the eighth reset transistor RST8 is turned ON and the potential of the FD region FD8 is reset. Accordingly, at the time point indicated by the broken line t3, signals both at reset level are read out via the first and the fourth vertical signal lines 25a and 25d respectively.

Next, by a transfer pulse at H level being supplied as the seventh control signal φTx7, the seventh transfer transistor section Tx-7 is turned ON. Due to this, the charges that have been generated by the first and third photodiodes PD-1 and PD-3 are both transferred to the FD region FD7. And, by a transfer pulse at H level being supplied as the control signal φTx8 simultaneously with the supply of the control signal φTx7, the eighth transfer transistor section Tx-8 is turned ON. Due to this, the charges that have been generated by the second and fourth photodiodes PD-2 and PD-4 are both transferred to the FD region FD8. As a consequence, at the time point shown by the broken line t4, signals based upon the sums of signals at signal level (i.e. a signal based upon the sum of the charges respectively generated by the first and second photodiodes PD-1 and PD-3, and a signal based upon the sum of the charges respectively generated by the third and fourth photodiodes PD-2 and PD-4) are respectively read out via the first and fourth vertical signal lines 25a and 25d.

While various embodiments and variant embodiments have been explained in the above description, the present invention is not to be considered as being limited to the details thereof. Other variations that are considered to come within the range of the technical concept of the present invention are also included within the scope of the present invention.

The content of the disclosure of the following application, upon which priority is claimed, is herein incorporated by reference.

Japanese Patent Application No. 2017-68452 (filed on Mar. 30, 2017).

REFERENCE SIGNS LIST

1: camera
2: image capturing optical system
3: image sensor
9: microprocessor
10: focus calculation unit
13: image processing unit
20, 20G, 20R, 20B: pixels
21: vertical scan circuit
22: horizontal scan circuit
23, 24: control signal lines
25a, 25b, 25c, 25d: vertical signal lines
AMP1 through AMP8: amplification transistors
FD1 through FD8: FD regions
PD-1 through PD-4: photodiodes
SEL1 through SEL8: selection transistors
Tx-1, Tx-2, Tx-3, Tx-4: transfer transistors
Tx-3 through Tx-8: transfer transistor sections

The invention claimed is:

1. An image sensor comprising a plurality of pixels, each comprising:
    a first photoelectric conversion unit that performs photoelectric conversion upon light that has passed through a micro lens and generates a charge;
    a second photoelectric conversion unit that performs photoelectric conversion upon light that has passed through the micro lens and generates a charge;
    a first accumulation unit that accumulates the charge generated by the first photoelectric conversion unit;
    a second accumulation unit that accumulates the charge generated by the second photoelectric conversion unit;
    a third accumulation unit that accumulates the charge generated by the first photoelectric conversion unit and the charge generated by the second photoelectric conversion unit;
    a first transfer unit that transfers the charge generated by the first photoelectric conversion unit to the first accumulation unit;
    a second transfer unit that transfers the charge generated by the second photoelectric conversion unit to the second accumulation unit; and
    a third transfer unit that transfers the charge generated by the first photoelectric conversion unit and the charge generated by the second photoelectric conversion unit to the third accumulation unit.

2. An image sensor according to claim 1, wherein:
    the third accumulation unit accumulates a charge that is the sum of the charge generated by the first photoelectric conversion unit and the charge generated by the second photoelectric generation unit.

3. An image sensor according to claim 1, wherein:
    the difference between an electrostatic capacitance of the first accumulation unit and an electrostatic capacitance of the second accumulation unit is less than a value that is determined in advance, and the difference between the electrostatic capacitance of the first accumulation unit or the electrostatic capacitance of the second accumulation unit and an electrostatic capacitance of the third accumulation unit is less than a value that is determined in advance.

4. An image sensor according to claim 1, wherein:
    the first accumulation unit, the second accumulation unit, and the third accumulation unit are shared between adjacent pixels in a first direction.

5. An image sensor according to claim 1, wherein:
    the first accumulation unit and the second accumulation unit are shared between one pair of adjacent pixels in a first direction, and the third accumulation unit is shared between another pair of adjacent pixels in the first direction.

6. An image sensor according to claim 1, further comprising:
    a connection unit that is capable of electrically connecting together the first accumulation unit and the second accumulation unit.

7. An image sensor according to claim 1, wherein each of the pixels comprises:
- a first output unit that outputs a signal based upon the charge accumulated in the first accumulation unit;
- a second output unit that outputs a signal based upon the charge accumulated in the second accumulation unit; and
- a third output unit that outputs a signal based upon the charge accumulated in the third accumulation unit.

8. An image sensor according to claim 7, wherein:
- at least one among the plurality of pixels, along with outputting from the first output unit a signal based upon the charge accumulated in the first accumulation unit, also outputs from the second output unit a signal based upon the charge accumulated in the second accumulation unit; and
- at least one among the plurality of pixels outputs from the third output unit a signal based upon the charge accumulated in the third accumulation unit.

9. An image sensor according to claim 7, wherein:
the difference between an efficiency of generation of the signal outputted from the first output unit and an efficiency of generation of the signal outputted from the second output unit is less than a value specified in advance, and the difference between the efficiency of generation of the signal outputted from the first output unit or the signal outputted from the second output unit and an efficiency of generation of the signal outputted from the third output unit is less than a value specified in advance.

10. An image sensor according to claim 7, further comprising:
a selection unit that selects either the first output unit and the second output unit, or the third accumulation unit, and outputs a signal.

11. An image sensor according to claim 7, wherein:
the third output unit is common with the first output unit or the second output unit.

12. An image sensor according to claim 11, wherein, when the third output unit outputs a signal based upon the charge accumulated in the third accumulation unit to the first output unit or to the second output unit:
- the third output unit of one adjacent pixel outputs a signal based upon the charge accumulated in the third accumulation unit to the first output unit; and
- the third output unit of another adjacent pixel outputs a signal based upon the charge accumulated in the third accumulation unit to the second output unit.

13. A focus adjustment device, comprising:
- a image sensor according to claim 1, that captures an image formed by an optical system that comprises a focusing lens; and
- a control unit that, based upon a signal according to the charge accumulated in a first accumulation unit of the image sensor and a signal according to the charge accumulated in a second accumulation unit of the image sensor, controls a position of the focusing lens so as to focus an image formed upon the image sensor by the optical system.

14. An imaging device, comprising:
- an image sensor according to claim 1, that captures an image formed by an optical system that comprises a focusing lens;
- a control unit that, based upon a signal according to the charge accumulated in a first accumulation unit of the image sensor and a signal according to the charge accumulated in the second accumulation unit of the image sensor, controls a position of the focusing lens so as to focus an image formed upon the image sensor by the optical system; and
- a generation unit that generates image data based upon a signal according to the charge accumulated in the third accumulation unit.

15. An imaging device according to claim 14, further comprising:
a changeover unit that changes over between reading out the signal according to the charge accumulated in a first accumulation unit of the image sensor and the signal according to the charge accumulated in the second accumulation unit of the image sensor, and the signal according to the charge accumulated in the third accumulation unit.

16. An imaging device comprising:
- an image sensor according to claim 6; and
- a generation unit that generates image data based upon at least one of charge accumulated in the first accumulation unit and the second accumulation unit that are connected together by the connection unit, and the charge accumulated in the third accumulation unit.

* * * * *